United States Patent
Kim-Whitty

(10) Patent No.: US 10,113,610 B2
(45) Date of Patent: Oct. 30, 2018

(54) METHOD FOR IMPROVED SEMICONDUCTOR PROCESSING EQUIPMENT TOOL PEDESTAL / PAD VIBRATION ISOLATION AND REDUCTION

(71) Applicant: SK COMMERCIAL CONSTRUCTION, INC., Belton, TX (US)

(72) Inventor: Suk K. Kim-Whitty, Belton, TX (US)

( * ) Notice: Subject to any disclaimer, the term of this patent is extended or adjusted under 35 U.S.C. 154(b) by 0 days.

(21) Appl. No.: 15/640,558

(22) Filed: Jul. 2, 2017

(65) Prior Publication Data

US 2018/0283486 A1 Oct. 4, 2018

Related U.S. Application Data

(63) Continuation-in-part of application No. 15/495,887, filed on Apr. 24, 2017, which is a continuation-in-part
(Continued)

(51) Int. Cl.
*F16F 15/04* (2006.01)
*F16F 15/02* (2006.01)
(Continued)

(52) U.S. Cl.
CPC .............. *F16F 15/04* (2013.01); *E04C 3/36* (2013.01); *F16F 15/005* (2013.01); *F16F 15/02* (2013.01);
(Continued)

(58) Field of Classification Search
CPC .............. E04F 15/024; E04F 15/02429; E04F 15/02488; E04F 15/02435; E04C 3/36; E04B 5/328; F16F 15/04
(Continued)

(56) References Cited

U.S. PATENT DOCUMENTS 2,116,654 A * 5/1938 Barge ............... E04B 1/8218
  181/207
2,686,009 A * 8/1954 Crowe ............... E01B 9/683
  106/15.05
(Continued)

FOREIGN PATENT DOCUMENTS

DE   2164897 A1 * 7/1973 ........ E04F 15/02429
DE   19641812 B4 * 11/2004 ............. E04F 15/22
(Continued)

*Primary Examiner* — Eret C McNichols
(74) *Attorney, Agent, or Firm* — Hulsey, P.C.

(57) ABSTRACT

A method to improve vibration isolation in semiconductor process level inhibits vibration frequencies transmitted through building structure from production tools, pumps, compressors, chillers, AHUs (Air Handling Units), and footfalls traffic on raised floor system on to tool pedestals and pads from affecting semiconductor fabrication processes. Rapid advancement and technological evolution in semiconductor industry foresee the imminent requirements for decrease in semiconductor chip node sizes to single digit nanometer. Dealing with such advancements, the tool pedestal systems are also requiring tighter specifications for stiffness and vibration isolation/reduction. Some key tools used in the semiconductor fabrication process require improved barrier from electromagnetic interference (EMI), as the disturbance from EMI degrade the performance of semiconductor processing tools that are key to the fabrication process and production yield rate.

9 Claims, 21 Drawing Sheets

Related U.S. Application Data of application No. 15/472,154, filed on Mar. 28, 2017, now Pat. No. 9,995,365.

(51) Int. Cl.
| | |
|---|---|
| *G03F 7/20* | (2006.01) |
| *F16F 15/00* | (2006.01) |
| *H02K 5/24* | (2006.01) |
| *E04C 3/36* | (2006.01) |
| *F16M 7/00* | (2006.01) |
| *H01L 21/67* | (2006.01) |
| *H01L 21/687* | (2006.01) |
| *E04F 15/024* | (2006.01) |
| *E04B 5/32* | (2006.01) |

(52) U.S. Cl.
CPC ............... *F16M 7/00* (2013.01); *G03F 7/709* (2013.01); *G03F 7/70808* (2013.01); *H01L 21/67017* (2013.01); *H01L 21/68792* (2013.01); *H02K 5/24* (2013.01); *E04B 5/328* (2013.01); *E04F 15/024* (2013.01); *E04F 15/02429* (2013.01); *E04F 15/02435* (2013.01); *E04F 15/02488* (2013.01); *F16F 2224/0225* (2013.01); *F16F 2226/04* (2013.01)

(58) Field of Classification Search
USPC ....... 248/581, 618, 621, 622, 632, 633, 638; 52/126.5, 126.6, 167.7–167.9
See application file for complete search history.

(56) References Cited

U.S. PATENT DOCUMENTS

| | | | | | |
|---|---|---|---|---|---|
| 2,776,101 | A | * | 1/1957 | McDermott | F16F 1/36 248/633 |
| 2,914,275 | A | * | 11/1959 | Mitchell | F16F 1/376 181/207 |
| 3,181,664 | A | * | 5/1965 | Aagaard | E04B 1/0007 52/238.1 |
| 3,606,704 | A | * | 9/1971 | Denton | E04F 15/024 5/24 |
| 4,209,868 | A | * | 7/1980 | Tada | E01D 19/043 14/73.5 |
| 4,258,516 | A | * | 3/1981 | Mori | E04F 15/02476 52/126.6 |
| 4,261,149 | A | * | 4/1981 | Gustafson | E04B 1/34352 52/292 |
| 4,330,974 | A | * | 5/1982 | Fleisch | A47B 3/00 248/225.21 |
| 4,425,980 | A | * | 1/1984 | Miles | B64C 1/40 181/208 |
| 4,546,580 | A | * | 10/1985 | Ueno | E04D 11/005 52/126.1 |
| 4,581,863 | A | * | 4/1986 | Thaler | E04B 13/1407 248/354.3 |
| 4,593,501 | A | * | 6/1986 | Delfosse | E04B 1/98 188/378 |
| 4,766,708 | A | * | 8/1988 | Sing | E04H 9/02 248/585 |
| 4,856,626 | A | * | 8/1989 | Nakanishi | F16F 3/08 188/268 |
| 4,899,323 | A | * | 2/1990 | Fukahori | E04B 1/36 248/560 |
| 4,901,490 | A | * | 2/1990 | Zinniel | E04F 15/02405 248/346.5 |
| 5,111,627 | A | * | 5/1992 | Brown | E04F 15/024 52/126.5 |
| 5,197,707 | A | * | 3/1993 | Kohan | F16F 7/01 248/562 |
| 5,205,091 | A | * | 4/1993 | Brown | E04F 15/024 52/126.6 |
| 5,265,386 | A | * | 11/1993 | Muhlethaler | E04F 15/024 52/126.6 |
| 5,389,737 | A | * | 2/1995 | Kobayashi | E04F 15/02435 174/483 |
| 5,433,045 | A | * | 7/1995 | Yano | E04H 9/021 248/581 |
| 5,462,141 | A | * | 10/1995 | Taylor | E04H 9/02 188/280 |
| 5,572,842 | A | * | 11/1996 | Stief | E04F 15/02429 52/144 |
| 5,653,070 | A | * | 8/1997 | Seguin | F16F 15/02 248/621 |
| 5,691,806 | A | * | 11/1997 | Tokuda | G03F 7/708 355/53 |
| 5,862,638 | A | * | 1/1999 | Holland | F16F 1/40 248/562 |
| 5,884,440 | A | * | 3/1999 | Kubo | E04H 9/022 52/167.1 |
| 6,070,381 | A | * | 6/2000 | Blumer | E04F 15/02488 156/71 |
| 6,208,408 | B1 | * | 3/2001 | Takabayashi | G03F 7/70241 355/53 |
| 6,266,133 | B1 | * | 7/2001 | Miyajima | G03B 27/58 355/72 |
| 6,354,048 | B1 | * | 3/2002 | Gillett | E04F 15/02447 52/220.1 |
| 6,488,600 | B1 | * | 12/2002 | Gordon | A63B 5/11 473/415 |
| 6,494,012 | B2 | * | 12/2002 | Seng | E04B 1/24 52/309.14 |
| 6,494,149 | B1 | * | 12/2002 | De Groot | B65D 19/38 108/56.3 |
| 6,510,660 | B1 | * | 1/2003 | Michioka | E04H 9/02 52/1 |
| 6,536,990 | B2 | * | 3/2003 | Schubert | B60R 19/34 248/351 |
| 6,618,122 | B2 | * | 9/2003 | Bisschops | F16C 32/0603 355/53 |
| 6,648,295 | B2 | * | 11/2003 | Herren | F16F 15/0275 248/562 |
| 7,650,726 | B2 | * | 1/2010 | Jakob-Bamberg | E04B 5/48 248/188.2 |
| 7,762,026 | B2 | * | 7/2010 | Smelser | E04C 3/02 52/167.1 |
| 7,765,756 | B2 | * | 8/2010 | Bontrager, II | E04D 11/02 428/316.6 |
| 7,849,646 | B2 | * | 12/2010 | Harinishi | E04F 15/225 248/633 |
| 8,176,690 | B2 | * | 5/2012 | Stanley | E04B 1/14 52/274 |
| 8,215,245 | B2 | * | 7/2012 | Morrison | F16F 1/3732 108/91 |
| 8,231,098 | B2 | * | 7/2012 | Ryaboy | F16F 15/02 188/378 |
| 8,641,492 | B2 | * | 2/2014 | Meyer | H05K 7/20745 454/184 |
| 8,733,037 | B2 | * | 5/2014 | Bindschedler | E04D 11/007 52/126.5 |
| 8,863,471 | B2 | * | 10/2014 | Pfluger | E04F 15/02488 52/1 |
| 9,038,324 | B2 | * | 5/2015 | Kugler | E04F 15/02464 52/126.6 |
| 9,284,107 | B2 | * | 3/2016 | Schultz | F16F 15/067 |
| 2003/0037997 | A1 | * | 2/2003 | Sakata | F16F 13/305 188/71.5 |
| 2004/0128939 | A1 | * | 7/2004 | Kim | E04B 5/12 52/650.3 |
| 2006/0006307 | A1 | * | 1/2006 | Mogilever | F16F 15/04 248/638 |
| 2006/0272111 | A1 | * | 12/2006 | Kim | E01D 19/125 14/73 |
| 2008/0202846 | A1 | * | 8/2008 | Gernhart | F16F 15/04 181/208 |
| 2008/0218970 | A1 | * | 9/2008 | Kehret | H05K 7/1434 361/699 |

(56) References Cited

U.S. PATENT DOCUMENTS

| | | | |
|---|---|---|---|
| 2008/0222973 A1* | 9/2008 | Lee | E04F 15/02476 52/126.1 |
| 2009/0094906 A1* | 4/2009 | Sato | E04H 9/021 52/167.4 |
| 2010/0281789 A1* | 11/2010 | Vac | E04F 15/02458 52/126.5 |
| 2014/0345210 A1* | 11/2014 | Gentili | E04H 9/023 52/167.8 |
| 2016/0002468 A1* | 1/2016 | Heikkila | B29C 67/0081 428/35.6 |
| 2016/0146283 A1* | 5/2016 | Sato | F16F 15/04 267/141.1 |
| 2016/0289961 A1* | 10/2016 | Gill | B32B 15/08 |
| 2016/0334718 A1* | 11/2016 | Butler | F16F 15/0232 |
| 2017/0037928 A1* | 2/2017 | Kronkright | F16F 7/01 |
| 2017/0082532 A1* | 3/2017 | Ryaboy | F16F 15/02 |
| 2017/0167138 A1* | 6/2017 | Thompson | E04C 3/29 |

FOREIGN PATENT DOCUMENTS

| | | | | |
|---|---|---|---|---|
| WO | WO 2007048204 A1 * | 5/2007 | | E04F 15/02476 |
| WO | WO 2016158382 A1 * | 10/2016 | | E04G 23/02 |

\* cited by examiner

METHOD FOR IMPROVED SEMICONDUCTOR PROCESSING EQUIPMENT TOOL PEDESTAL / PAD VIBRATION ISOLATION AND REDUCTION

CROSS REFERENCE TO RELATED APPLICATIONS

This application claims benefit to the following non-provisional United States Patent Applications:

Ser. No. 15/472,154, entitled "METHOD AND SYSTEM FOR IMPROVED SEMICONDUCTOR PROCESSING EQUIPMENT VIBRATION ISOLATION AND REDUCTION," filed on Mar. 28, 2017, which is here expressly incorporated by reference and made a part of this application; and Ser. No. 15/495,887, entitled "METHOD FOR IMPROVED SEMICONDUCTOR PROCESSING EQUIPMENT TOOL PEDESTAL/PAD VIBRATION ISOLATION AND REDUCTION," filed on Apr. 24, 2017, which is here expressly incorporated by reference and made a part of this application.

FIELD OF THE INVENTION

The present disclosure relates to semiconductor and similar high precision processing facilities and, more particularly to a method for improved semiconductor processing equipment tool pedestal/pad vibration isolation and reduction and the like, additionally the present disclosure provides a method and system for improved semiconductor processing equipment vibration isolation and reduction by transforming vibration conducting properties of fabrication equipment as installed within a fabrication facility.

BACKGROUND OF THE INVENTION

Generally, the present disclosure relates to isolation of vibration frequency for Semiconductor tool pedestal/pad and raised floor system. The following description is intended to the reader for better understanding the various aspect of present disclosure. It should be understood that these statements are to be read in this light, and not as admissions of prior art.

As semiconductor chips are advancing to smaller nanometer size, the need for isolation of unwanted vibration frequency now takes a central position in fabrication facility design and operation. Low frequency vibration may affect production tools such as lithograph tools and, thereby, lower production yield rate in semiconductor fabrication. Foot traffic over raised floor systems, oscillating pumps, compressors, chillers and AHUs (air handling units) produce low vibration frequencies transmitted through building and clean room floor structure. Contributing to unwanted vibration frequencies, many lines and pipes from pumps, compressors, chiller attach to pedestal under these tools without vibration isolation support mounts. Due to cost and installation time, only critical semiconductor production tools are equipped with vibration controlled and/or active isolation or vibration dampening tool pedestals and pads; most tools relied on it's built in passive vibration isolation systems for vibration control.

Most semiconductor fabrication facilities are routinely remodeled, modified, repurposed multiple times to accommodate new technology due to enormous building cost and prolonged build time. Majority of the semiconductor facilities are remodeled facilities and are designed for previous equipment and vibration requirements, which were built 5, 10, 15 plus years ago.

New semiconductor tools have larger tool footprint, additional increase MEP lines accessed from below the tooling. To accommodate new semiconductor tools, height of raised floor system for the Process level or area has been increased; which many steel and aluminum members also increased in size and diameter. In many instances, areas, which were not designed with "waffle floors", are raised even higher with elevated floor systems to meet cleanroom downdraft air movement specification. As floor or tool pedestal are raised higher, many hollow steel or aluminum member are used to keep the weight and cost to minimum.

Many semiconductor production support tools are capable of working and supporting new critical dimension production tools, such as lithography tools with or without modifications. New production tools have tighter vibration frequency requirements, which are equipped with designed specific vibration isolated tool pedestal and pads. However, new critical tools are usually operating in conjunction with older support tools with outdated vibration specifications. In many occasions, older tools only rely on its built-in passive vibration isolation systems, for vibration control. Economically, replacing all support tools with matching vibration specification for new key production tools is not feasible.

Improvement for isolation of vibration frequency transmitted through building structure is needed for better production yield rate. It must be economical, schedule driven and with minimal weight for ease of material handling and installation.

One particularly important platform for semiconductor device fabrication is the semiconductor tool pedestal, which provides a platform supporting the production equipment. The requirements for tool pedestal vary depending on the type. The structural requirements are stiffness, mass and vibration isolation mechanism. From the list of many different types of semiconductor production tool pedestals, the lithography tool pedestal has higher demand for requirements. As semiconductor chip node size decreases, list of tool pedestal requiring higher requirements for stiffness, isolation/reduction of vibration are increasing. Such tools are chemical-mechanical planarization (CMP) tool and analysis tool pedestal. In addition, other support tools pedestals are requiring higher level of stiffness and reduction/isolation of vibration requirements, due to fabrication production tool weight increase, and additional number and size of MEP access holes in the tool pedestals. Cost effective means to reduced/isolate vibration and ease of material handling and installation is needed.

Many older semiconductor production support pedestal tools still meet the design and strength requirements for supporting new critical production tools. New production tools have tighter requirements, such as stiffness, vibration isolation and increased electromagnetic interference (EMI) barrier. Rewiring and or retrofitting/additional shielding all EMI emitting electrical lines around EMI sensitive tools to meet new EMI tolerance requirements are not economically feasible.

Disturbance from EMI may degrade the performance of semiconductor processing tools, largely affecting production yield rate. For such reason, most of the modern semiconductor fabrication facilities prohibit the personal use of radio, mobile and other external EMI producing devices inside the FAB. All semiconductor processing tools are surrounded by power and communication data lines below the raised floor and tool pedestal system, producing certain level of EMI. Modern semiconductor production tools have improved insulation from EMI; however, as semiconductor industry is evolving continuously and gradually reducing the chip nodes sizes, improving EMI barrier becomes crucial to many key production tools.

In light of the above, a further need exists for providing a method and system for improved semiconductor processing equipment vibration isolation and reduction.

There is the need for a method and system for eliminating or substantially reducing low frequency vibrations which affect production tools such as lithograph tools by lowering production yield rate in semiconductor fabrication.

There is a further need for a method and system for reducing or preventing the effects of vibration sources, such as foot traffic over raised floor system, pumps, compressors, chillers and AHUs (air handling units) that produce low vibration frequencies transmitted through building and clean room floor structures.

A need exists for a method and system to allow semiconductor production tools having tighter vibration frequency requirements to operate effectively in conjunction with older support tools with outdated vibration specifications.

Furthermore, a need exists for the ability to avoid the enormous expense of replacing all old support tools with new ones having vibration specification matching new key production tools. That is, there is the need to eliminate or substantially reduce the considerations of vibration and noise control in equipment operation from decisions of how and when to replace older equipment.

In addition to the above concerns, there are concerns relating to the need for a method for improved semiconductor processing equipment tool pedestal/pad vibration isolation and reduction. The semiconductor industry is evolving continuously and gradually reducing the chip nodes sizes. The tool pedestal/pad (hereafter denoted as tool pedestal) for modern semiconductor FABs are required have very small tolerance to ambient vibration. Therefore, reduction and isolation of vibration of tool pedestal/pad is the key requirement for safe, reliable and uninterrupted operation of modern semiconductor FABs.

Vibration causes deflection and deflection causes damaging effect to the costly high-precision machine tools, which, in turn, reduces production yield rate. There is a need for a way to suppress the transmission of vibration from the supporting system to machine tools.

A further need exists for and improved the method for improved semiconductor processing equipment tool pedestal/pad vibration isolation and reduction presented that provides a cost-effective, easy-to-fabricate, easy-to-handle, and reliable solutions to vibration suppression and isolation for semiconductor FABs.

BRIEF SUMMARY OF THE INVENTION

The disclosed subject matter provides for improved vibration control and protection for semiconductor fabrication equipment, additionally the present disclosure provides a method and system for improved semiconductor processing equipment vibration isolation and reduction using an integrated system for eliminating vibration conduction paths throughout a fabrication facility.

In light of the above, the present disclosure provides a method to improve vibration isolation in semiconductor process facilities. The present method and system essentially eliminates vibration frequencies transmitted through a building structure from production tools, pumps, compressors, chillers, AHUs (Air Handling Units), and footfalls traffic on raised floor system on to tool pedestals and pads, within semiconductor. The method and system use sound proofing material and/or foam into fill or partially fill hollow steel and aluminum support members and sound proofing adhesives and caulks at point of connections in conjunction with mechanical fastening. In various applications, the present disclosure includes placement of shaped welded rod utilized for dissipating vibration energy in center of hollow member which is surrounded with sound proofing material or foam.

In summary, the present disclosure provides a method, system, and fabrication facility that eliminates or substantially reduces process-limiting vibrations within a high-precision device manufacturing facility, wherein an elevated structure supports high-precision device manufacturing equipment and provides vibration reduction spacing between a floor and an upper surface of said elevated structure. The method comprises the steps of separating a base of the elevated structure from the floor using a first vibration isolation pad structure. A vibration absorbing foam is filled a hollow portion of a vertical support structure separating the base from said upper surface. A second vibration isolation pad structure separates the vertical support structure from the upper structure of the elevated structure. In the present disclosure, the first vibration isolation pad structure, the vibration absorbing foam, and the second isolation pad structure coordinate to eliminate or substantially reduce the ability of vibrations from the floor to reach high-precision device manufacturing equipment operating on the upper surface of said elevated structure.

According to present teaching the disclosure includes a method, system, and semiconductor fabrication facility for eliminating or substantially reducing process-limiting vibrations within a high-precision device manufacturing facility. In such a disclosure an elevated structure supports high-precision device manufacturing equipment and provides vibration reduction spacing between a floor and an upper surface of said elevated structure. Here, the teachings involve separating a base of the elevated structure from the floor using a first vibration isolation pad structure. In addition, the present disclosure includes filling a hollow portion of a vertical support structure with vibration absorbing foam, the vertical support structure separating the base from the upper surface. The disclosure includes separating the vertical support structure from the upper structure of the elevated structure using a second vibration isolation pad structure. Accordingly, the coordination of the first vibration isolation pad structure, the vibration absorbing foam, and the second isolation pad structure coordinate to eliminate or substantially reduce the ability of vibrations from the floor to reach high-precision device manufacturing equipment operating on the upper surface of the elevated structure.

Application of the disclosed method and system improves isolation of vibration frequencies transmitted through building structures from tools in operation in process level (older support tools work with new key production tools) to pumps, compressors, chillers, AHUs (Air Handling Units), and footfalls traffic on raised floor system on to tool pedestals and pads.

The disclosed method and system include the use of dedicated MEP (mechanical, electrical, plumbing) support pedestals, only attach as support for MEP lines, as to improve isolation of low frequency vibration. With minimal weight increased for material for ease of material handling and installation, this method is intended for tools without specifically vibration frequency dampened and isolation designed tool pedestals and pads; which only relied on it's built in passive vibration isolation systems.

A technical advantage of the present disclosure includes reduction and isolation of vibration frequencies for improving production yields as semiconductor chip design is advancing in smaller nanometer critical dimensions for semiconductor device processing.

Another technical advantage of the present disclosure includes the ability to use the disclosed vibration isolation structures in addition to industry standard structures such as construction isolation joints, miniature damping pads between raised floor tiles to pedestal, and vibration isolation connectors for MEP lines.

A further technical advantage of the present disclosure includes the improved isolation of vibration frequencies transmitted through building structure to achieve better production yield rates. The method and system of the present disclosure are economical, schedule driven and impose minimal weight in the construction of material handling and installation facilities for nanometer-scale semiconductor fabrication facilities and similar high precision lithography and fabrication environments. As a result of the present teachings, semiconductor fabrication yields and process efficiencies greatly improve.

Yet a further beneficial aspect of the present disclosure is a method and system for eliminating or substantially reducing low frequency vibrations which affect production tools such as lithograph tools, so as to increase lithographic accuracy and yield percentages in semiconductor device fabrication.

Yet another technical advantage of the present disclosure includes the reduction of effects from vibration sources, such as foot traffic over raised floor system, pumps, compressors, chillers and AHUs (air handling units) that produce low vibration frequencies transmitted through building and clean room floor structures.

Yet a further technical advantage of the present disclosure includes the ability to allow newer semiconductor production tools having tighter vibration frequency requirements to operate effectively in conjunction with older support tools with outdated vibration specifications. The ability to extend older equipment useful live may result in process expense reductions and greater operational profits for semiconductor device fabrication facilities.

Technical advantages of the present disclosure include providing a hybrid system for eliminating/substantially reducing both high frequency vibrations and low frequency vibrations. High frequency vibrations may be considered, for example, Workshop (ISO), Office (ISO), Residential Day (ISO), and Operating Theatre (ISO) ranges of vibration, as defined here by the chart of FIG. 16. Low frequency vibrations may be considered those vibrations classified as VC-C, VC-D, and VC-E in FIG. 16. The teachings of the present disclosure provide the ability to establish an environment operating in the range of VC-E.

Another technical advantage of the present disclosure includes providing an active foam system using composite foam structures for vibration isolation. This design permits vibration isolation without having to modify entire structures, as well as with minimal overall weight variations as a result of vibration isolation modifications. The teachings of the present disclosure permit installation of composite foam within structural components rapidly and as little as one-day disruption in fabrication facility operations. As a result, the significant improvements of the present subject matter afford major operational and efficiency improvements with a most economical set of structural transformations to increase overall fabrication facility profitability and efficiency.

Finally, the present method and system provide the ability to avoid the enormous expense of replacing all old support tools with new ones having vibration specification matching new key production tools. In effect, the present disclosure enables the elimination or substantial reduction of many considerations of vibration and noise control in equipment operation.

BRIEF DESCRIPTION OF THE DRAWINGS

The present subject matter will now be described in detail with reference to the drawings, which are provided as illustrative examples of the subject matter so as to enable those skilled in the art to practice the subject matter. Notably, the FIGUREs and examples are not meant to limit the scope of the present subject matter to a single embodiment, but other embodiments are possible by way of interchange of some or all of the described or illustrated elements and, further, wherein.

DETAILED DESCRIPTION OF ILLUSTRATIVE EMBODIMENTS

Figure 1:
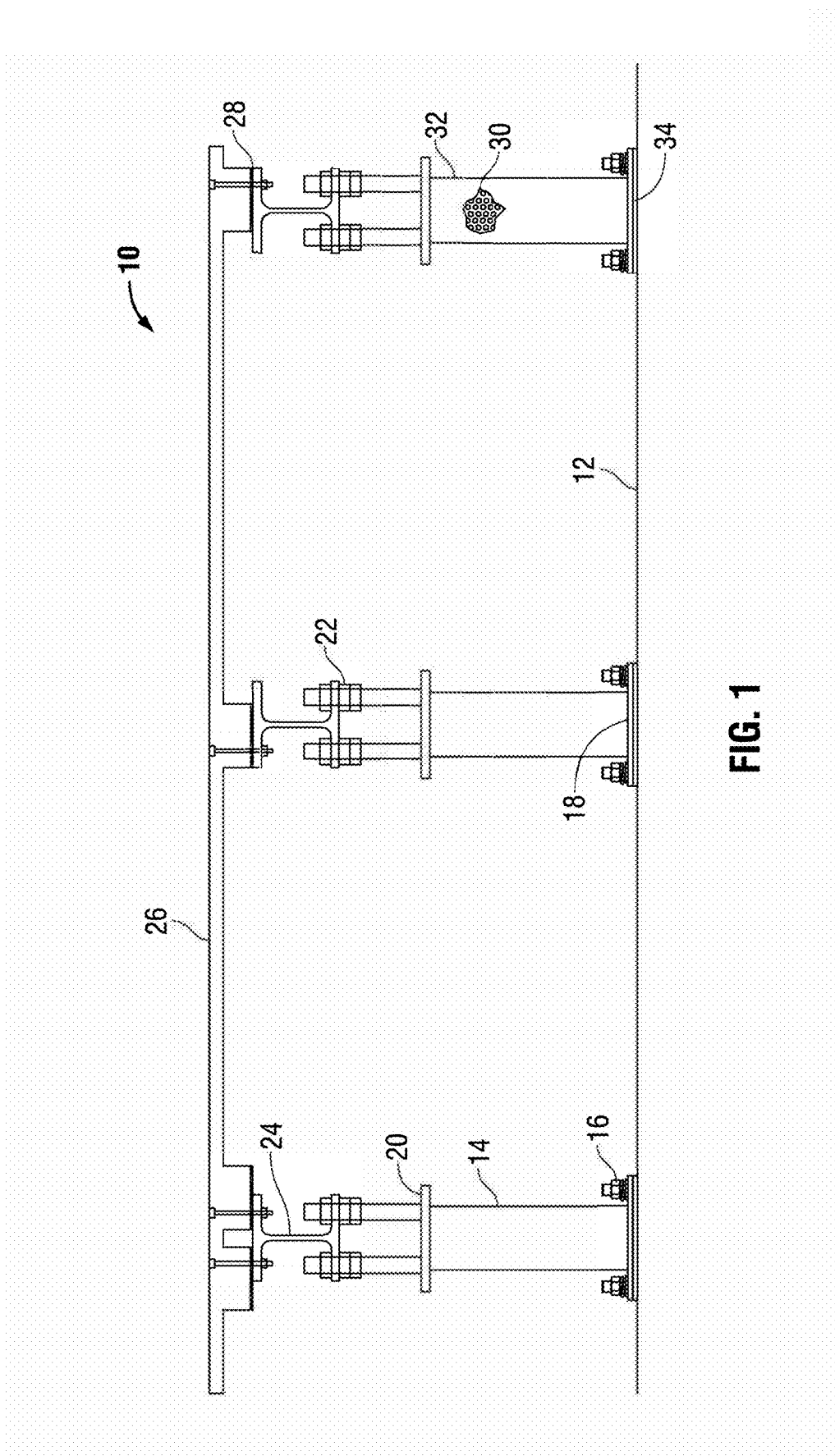
FIG. 1 shows a metal tool pedestal and pad with adjustable height hollow steel member pedestal configured consistent with the teachings of the present disclosure.

The detailed description set forth below in connection with the appended drawings is intended as a description of exemplary embodiments in which the presently disclosed process can be practiced. The term "exemplary" used throughout this description means "serving as an example, instance, or illustration," and should not necessarily be construed as preferred or advantageous over other embodiments. The detailed description includes specific details for providing a thorough understanding of the presently disclosed method and system. However, it will be apparent to those skilled in the art that the presently disclosed process may be practiced without these specific details. In some instances, well-known structures and devices are shown in block diagram form in order to avoid obscuring the concepts of the presently disclosed method and system.

In the present specification, an embodiment showing a singular component should not be considered limiting. Rather, the subject matter preferably encompasses other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present subject matter encompasses present and future known equivalents to the known components referred to herein by way of illustration.

The present disclosure shows a method to improve vibration isolation in semiconductor process level. Vibration frequencies transmitted through building structure from production tools, pumps, compressors, chillers, AHUs (Air Handling Units), and footfalls traffic on raised floor system on to tool pedestals/pads, within semiconductor are eliminated or substantially reduced. The present method and system use sound proofing material and foam into hollow steel or aluminum support members and sound proofing adhesives and/or caulking at point of joint connections in conjunction with mechanical fastening. In various applications, the present disclosure includes the placement of shaped welded rod for dissipating vibration energy in center of hollow members, such as vertical posts or pedestals, which are surrounded with sound proofing material or foam.

In addition, utilization of this method may be for dedicated MEP (mechanical, electrical, plumbing) support pedestal, only attach as support for MEP lines, as to improve isolation of low frequency vibration. As semiconductor chip design is advancing in smaller nanometer critical semiconductor device dimensions, reduction and isolation of vibration frequency is needed for improving production yield.

The subject matter of the present disclosure eliminates or substantially reduces shorts in sound transmission by creating barriers and spaced openings from ground or base level through the support vertical components to the equipment platforms they're above. In the support vertical components appear sound isolation foam, pads between metal structures and physical structures for receipt and transmission of vibrations at low-frequency that can adversely affect the operation of nanoscale semiconductor fabrication equipment.

With no equipment, there may be rubber pads and other pads to isolate metal from metal. However, over time such structures as rubber pads can become densified or brittle. In either case a sound short may arise between the metals and transmitted through the densified or brittle rubber or other material that otherwise would be used. This would cause unwanted vibration transmission.

In the present disclosure, as opposed to rubber pads, sound isolation caulking may be placed between the metal structures. Sound isolation caulking has properties of avoiding densification or brittlelization. As a result, sound and vibration are isolated at the low frequencies. With rubber pads and the like, there may be small voids that arise between the rubber pad on the metal surfaces. Instead of using such pads, or isolation structures, the use of sound isolation caulking allows for variations in dimensions and surface anomalies and yet provides sound isolation for structures that is continuous to fully prevent vibration transmission across the metal components.

By employing sound dampening between the metal structures, or, perhaps, and adhesive, the disclosure shows that vibration may not pass from one metal structure to another.

FIG. 1 is example of metal tool pedestal pad with adjustable height hollow steel member pedestal. With reference to FIG. 1, there appear metal tool pedestal 10 on floor 12 upon which adjustable hollow steel number 14 rests, with bolts 16 through base 18, and screw or otherwise fasten into floor 12. Adjustable height hollow steel member pedestal 14 includes vertical adjustment mechanism 20. Connecting at the top of vertical adjustment mechanism 20 appears bolt mechanism 22 having bolted there within I-beam 24. I-beam 24 bolts to metal tool pedestal base 26.

Metal tool pedestal 10 further includes soundproofing adhesive 28 positioned between I-beam 24 and pedestal base 26. Within hollow portion 30 of adjustable height hollow steel member 14 appears sound insulating foam 32. Between base 18 and floor 12, the present disclosure includes soundproofing adhesive 34. Instead of sound proofing adhesive 34, a sound proofing vibration proofing caulking may be used.

Figure 2:
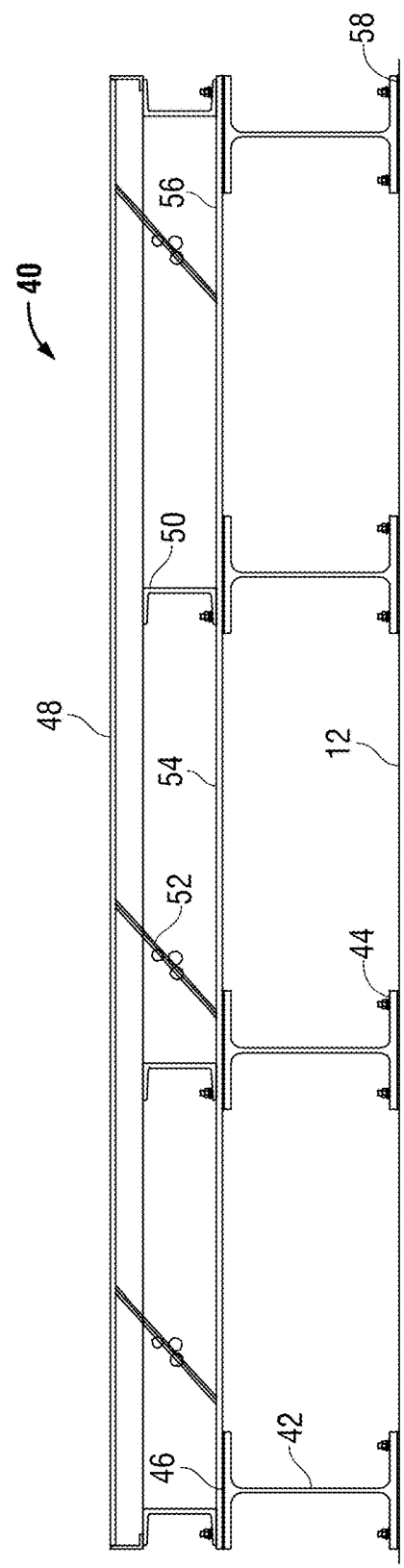
FIG. 2 depicts a concrete type tool pedestal supported with structural steel configured consistent with the teachings of the present disclosure.

FIG. 2 is example of concrete type tool pedestal supported with structural steel. With reference to FIG. 2, concrete type tool pedestal 40 includes structural steel beams 42 supported by base members 44. Structural beams 42 include upper joint 46 in a "T" shape and supporting pedestal base 48. Between pedestal base 48 in upper joint 46 appear metal spacers 50. Ties 52 provide further association between pedestal base 48 and upper joint 46. Spacers 50 connect between pedestal base 48 and bottom surface 54 and may be formed of a variety of materials to achieve vibration separation.

Adhesive soundproofing or vibration isolation caulking 56 serves as a vibration barrier between T portion 46 and bottom surface 54. Similarly, vibration isolation adhesive or caulking 58 separates base member 44 and floor 12.

Figure 3:
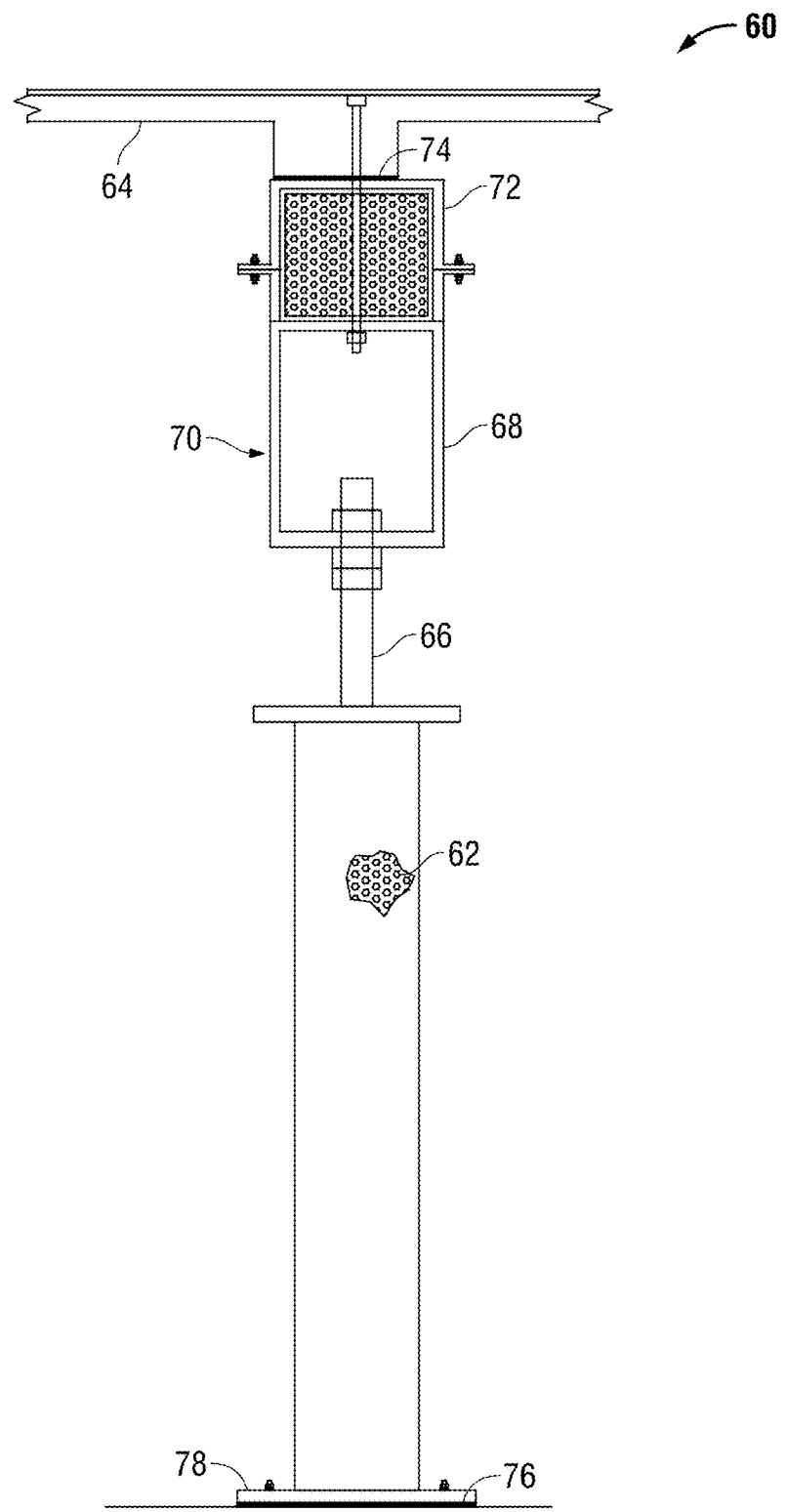
FIG. 3 exhibits a hollow horizontal structural member configured consistent with the teachings of the present disclosure.

FIG. 3 is example of hollow vertical structural member filled with sound proofing material or foam for a raised floor system. With reference to FIG. 3, hollow vertical structural member 60 may be filled with soundproofing material 62, which may be also a type of foam. Hollow vertical structural number 60 may be used for a raised floor system 64 and a metal pedestal.

Connecting from hollow vertical structural number 62 appears vertical tie 66 into hollow vertical support element 68. Hollow vertical support element 68 upper portion 70 may be filled with soundproofing material or vibration isolation material 72. In addition, adhesive pad or caulking separator 74 separates hollow vertical support element 68 from raised floor system 64. Likewise, soundproofing adhesive or vibration isolation caulking 76 separates base 78 of hollow vertical support member 60 from floor 12.

Figure 4:
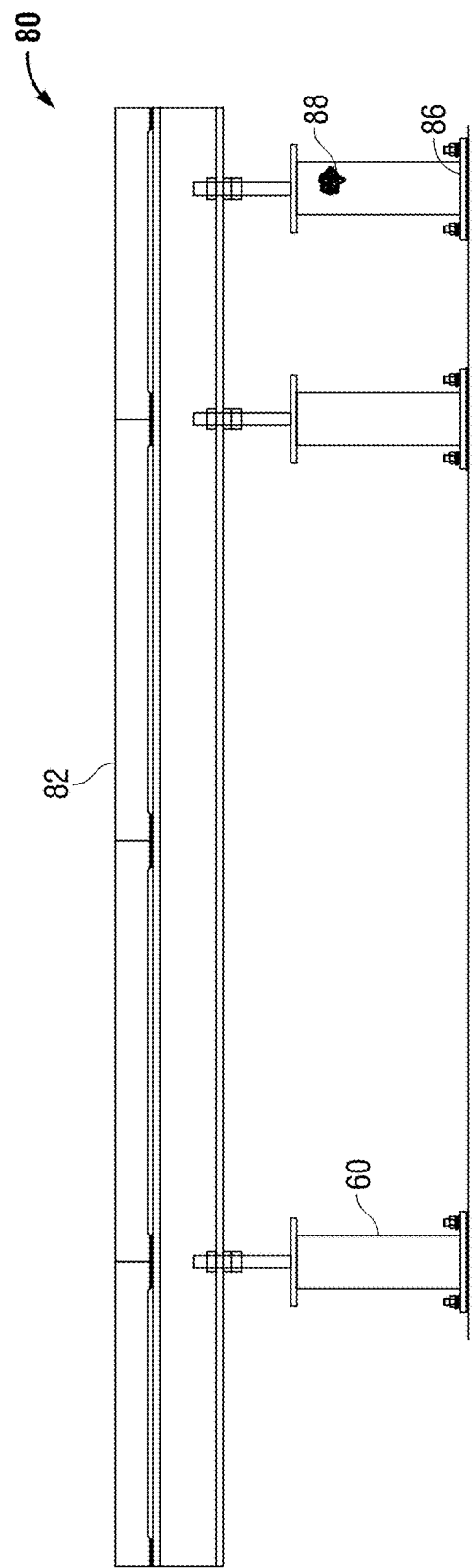
FIG. 4 presents a raised floor system on an adjustable hollow steel pedestal configured consistent with the teachings of the present disclosure.

FIG. 4 is an example of raised floor system on an adjustable hollow steel pedestal. With reference to FIG. 4, vibration isolation platform 80 includes an example of a raised floor system 82 supported by an adjustable hollow steel pedestal 60 to create a vibration isolation platform. As illustrated above, sound isolation phone 84 may be used to fill adjustable hollow steel pedestal 60 with at adhesive pad or vibration isolation caulking 86 separating adjustable hollow still pedestal 60 from floor 12.

FIG. 4 illustrates a type of structure which may be a metal support I-beam going across a vibration isolation platform. At the point of contact there is vibration isolation. Sound isolation caulking may be placed at the top of the platform beneath the platform stanchion, and along the vertical wall of the stanchion. Discontinuing use of sound isolation caulking provides a total reduction of vibration from the floor that may be receiving equipment vibrations through and prevents transmission of such vibrations up the vertical supports and then further provides a barrier as any further vibration may pass from the vertical support to the upper horizontal platform surface.

Figure 5:
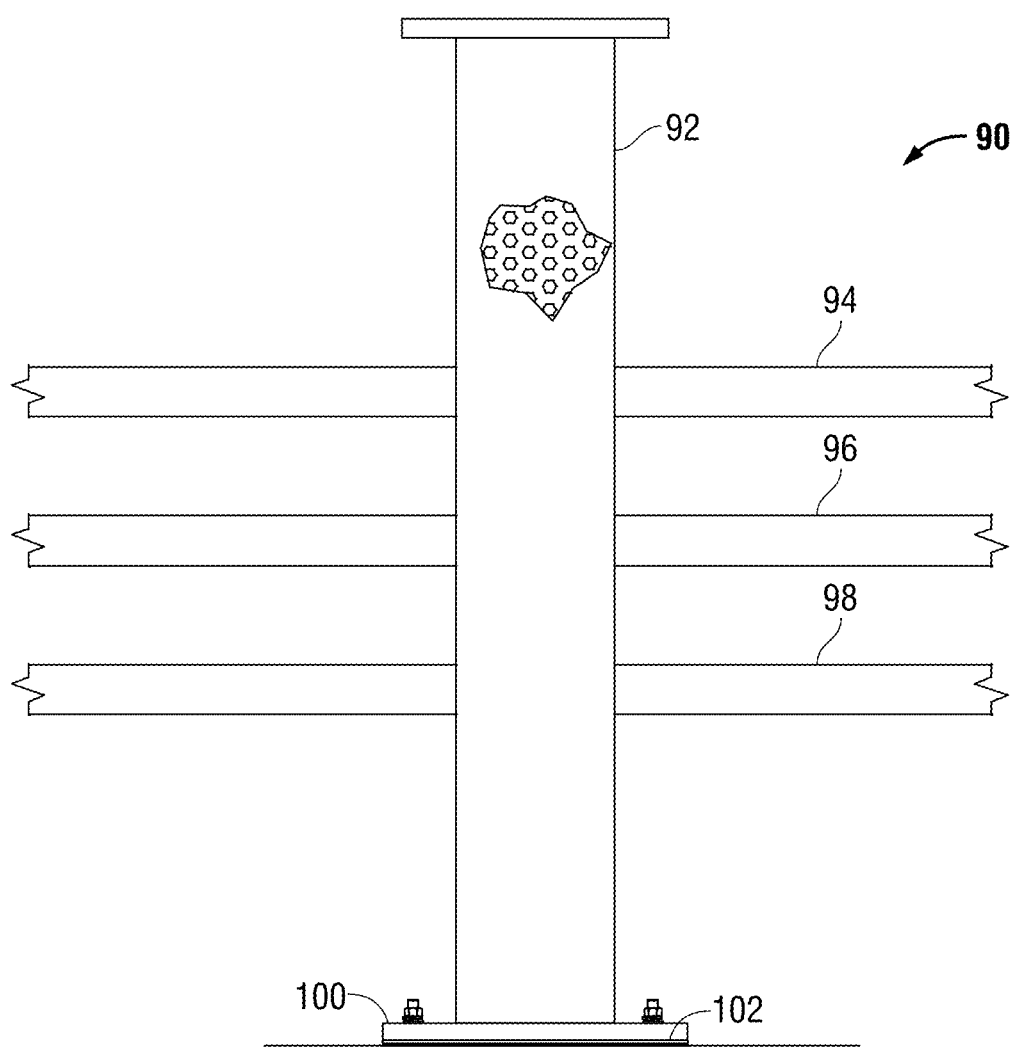
FIG. 5 shows a pedestal dedicated for MEP (mechanical, electrical, plumbing) line support configured consistent with the teachings of the present disclosure.

FIG. 5 is an example of a pedestal dedicated for MEP (mechanical, electrical, plumbing) line support. With reference to FIG. 5, pedestal configuration 94 passing mechanical, electrical, plumbing (MEP) line support while maintaining are improving sound or vibration isolation within the fabrication equipment setting. Pedestal 92 passes or allows the passage of mechanical line 94, Electrical line 96, and plumbing line 98. Base 100 supports pedestal 92 with adhesive or Caulking 102 separating bass 100, and therefore pedestal 92, from vibrations that may exist from floor 12.

FIG. 5 shows imposition of MEP lines in pedestal configuration 94 structure and how such might be vibration isolated for the purpose of the present disclosure. With MEP lines on the top of the support structure for such an equipment, there is frequently the attachment of the equipment to the vertical support structures. Such attachment ultimately results and a sound transmission path from the vertical stanchion or support to the supported equipment on the horizontal platform.

Figure 6:
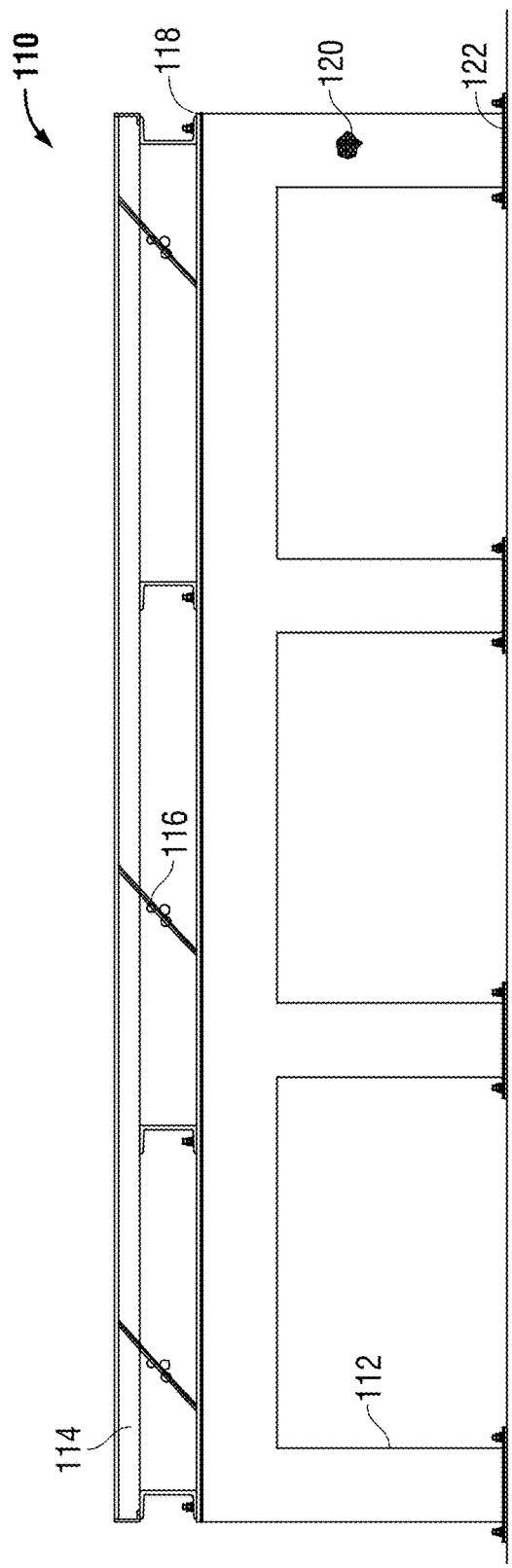
FIG. 6 presents a concrete type tool pedestal and pad configured consistent with the teachings of the present disclosure.

FIG. 6 is example of concrete type tool pedestal/pad supported with hollow structural steel/aluminum filled with sound proofing material/foam and sound proofing adhesive/caulking at point of connections. With reference to FIG. 6, concrete type tool pedestal 110 is supported with hollow structural steel/aluminum Field support 112 providing such structural support for concrete beam 114. Ties 116 on concrete beam 114 into position relative to hollow structural steel/aluminum supports 112. Between concrete type being 114 and follow structural steel/aluminum supports 112, appears adhesive pad or vibration isolation caulking 118.

Note that hollow structural steel/aluminum filled supports 112 may also receive soundproofing adhesive or vibration isolation 124. In addition, adhesive pad 122 may likewise be of use in separating vibration from floor 12 to hollow structural steel/aluminum filled supports 112.

Figure 7:
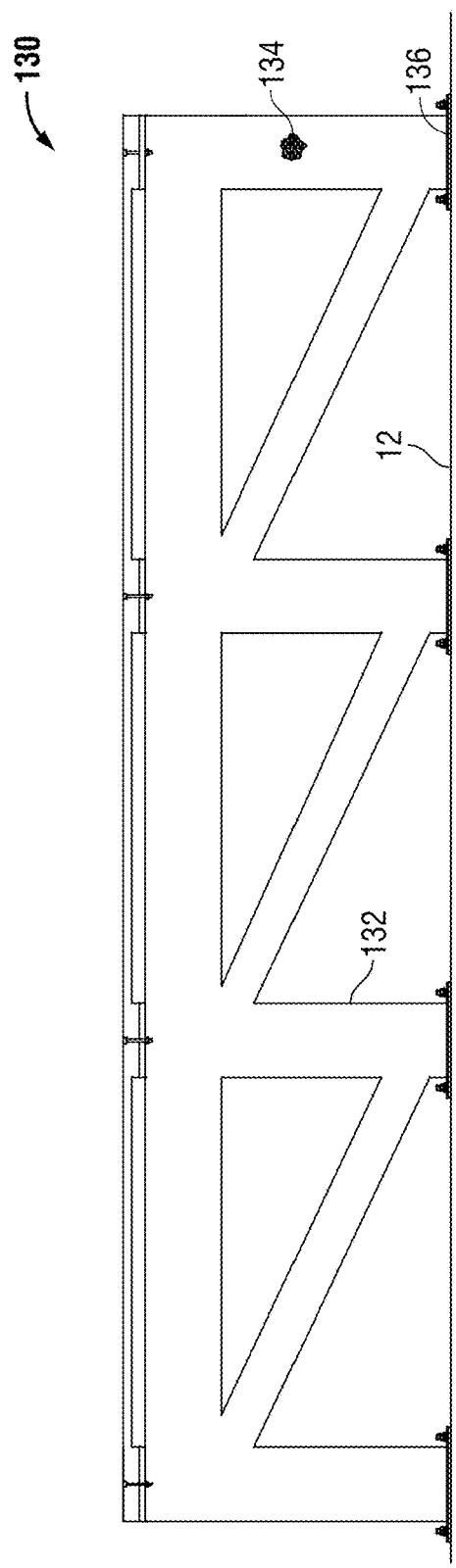
FIG. 7 depicts a metal type tool pedestal and pad configured consistent with the teachings of the present disclosure.

FIG. 7 is example of metal type tool pedestal/pad supported with hollow structural steel/aluminum filled with sound proofing material/foam and sound proofing adhesive or caulking at point of connections. With reference to FIG. 7, metal type tool pedestal/pad 130 supported by hollow structural steel/aluminum filled supports 132. How structural steel or aluminum supports 132 may be filled with sound isolation or vibration isolation foam 134. Between hollow structural steel/aluminum filter supports 132 and floor 12 also appear adhesive pads or vibration isolation caulking 136.

Figure 8:
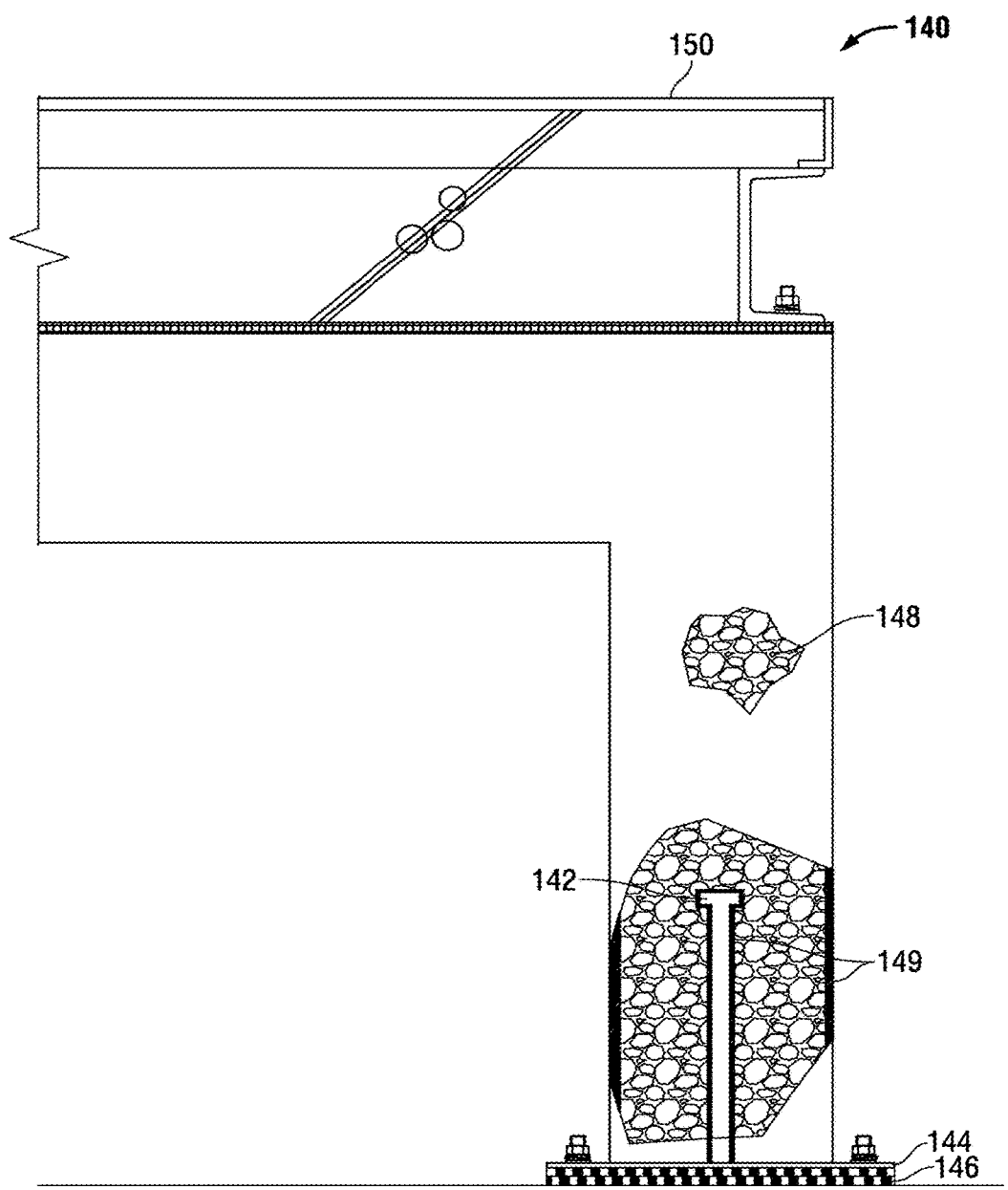
FIG. 8 displays square hollow member configured consistent with the teachings of the present disclosure.

FIG. 8 is example of square hollow member with a vibration energy dissipating rod surrounded in sound proofing material or foam and sound proofing adhesive/caulking at point of connections. With reference to FIG. 8, square hollow member 140 further includes vibration energy dissipating rod 142 that attaches to base 144. From base 144 through vibration energy dissipating rod 142 energy that may be sensed from floor 12 may be directed into sound isolation or vibration isolation phone 146. In addition, square member 140 may include an inner sound dampening pad or vibration isolation caulking 146 that may isolate vibration from the exterior surface of square hollow number 40 into sound dampening or vibration isolation foam 146. Thus, square member 140 architecture of FIG. 8 illustrate some sound barriers or vibration barriers that essentially eliminate or substantially reduce any vibration from floor 12 to upper pedestal layer 150.

The vibration isolation system aims for creating a barrier by absorbing part of the external vibration transmitted through the concrete/steel interface and confine it within the steel tube capsule by means of several energy absorbers. The energy dissipation mechanism constitutes a steel tube itself with rubber coating on the internal surface, energy dissipation rod mechanism with rubber coating on the external surface, and composite foam fill in between rod and tube wall. It is foreseen that the energy absorption rod may exhibit piston-type behavior due to presence of the composite foam fill. The type of vibration expected and range of frequencies needing suppression would determine the design properties of the components in the energy absorption mechanism. This includes sizing of the steel tube, top and bottom cap plates, geometry of the rod, and densities of the foam and rubber.

Figure 9:
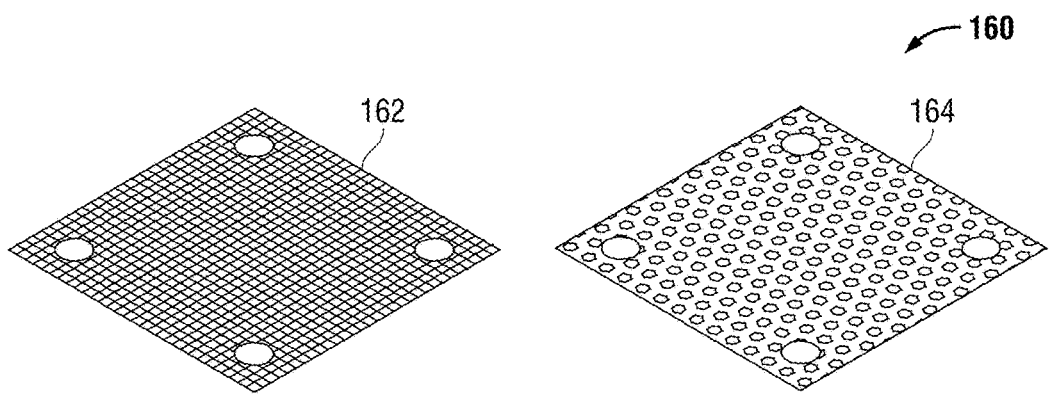
FIG. 9 shows part of a tile assembly for limiting vibration transmission throughout the semiconductor equipment platform structure.
Figure 10:
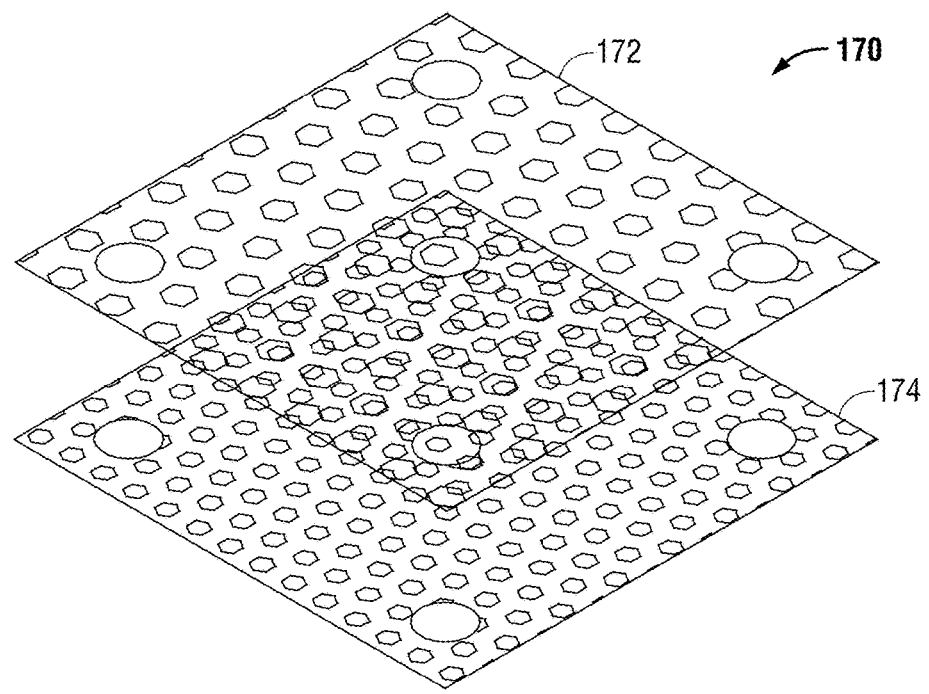
FIG. 10 depicts further aspects of a tile assembly for limiting vibration transmission throughout the base of a semiconductor equipment platform structure.

FIGS. 9 and 10 show part of a tile assembly for limiting vibration transmission throughout the semiconductor equipment platform structure. With reference to FIG. 9, tile set 160 includes first tile 162 and second tile 164. First tile 162 includes a screen or Mesh configuration for use on surfaces associated with a semiconductor equipment platform structure such as exhibited above FIGS. 1 through 8.

Note that the configuration of tiles 162 in tile 164 is such that the spacing between openings entire 162 are smaller than the openings in tile 164. This has a vibration canceling a fact in the sense that eliminates are substantially reduces sinusoidal vibration transmissions.

FIG. 10 depicts further aspects of a tile assembly for limiting vibration transmission throughout the base of a semiconductor equipment platform structure. With reference to FIG. 10, tile configuration 170 includes upper tile 172, which has different opening and spacing dimensions from lower tile 174. As such tiles are assembled the transmission of noise along or into a vibration dissipating platform I substantially improve.

Considering both tile assemblies 160 of FIG. 9 and tile assembly 170 of FIG. 10 and with reference to FIG. 8, notice that sound isolation pads 146 rest beneath base 144 of the structural member 140. This association of two separate tiles to mitigate vibration transfer from floor 12 to structural member of 140 has proven to be markedly effective in reducing her substantially eliminating transmission of vibration into hollow support member 134.

Figure 11:
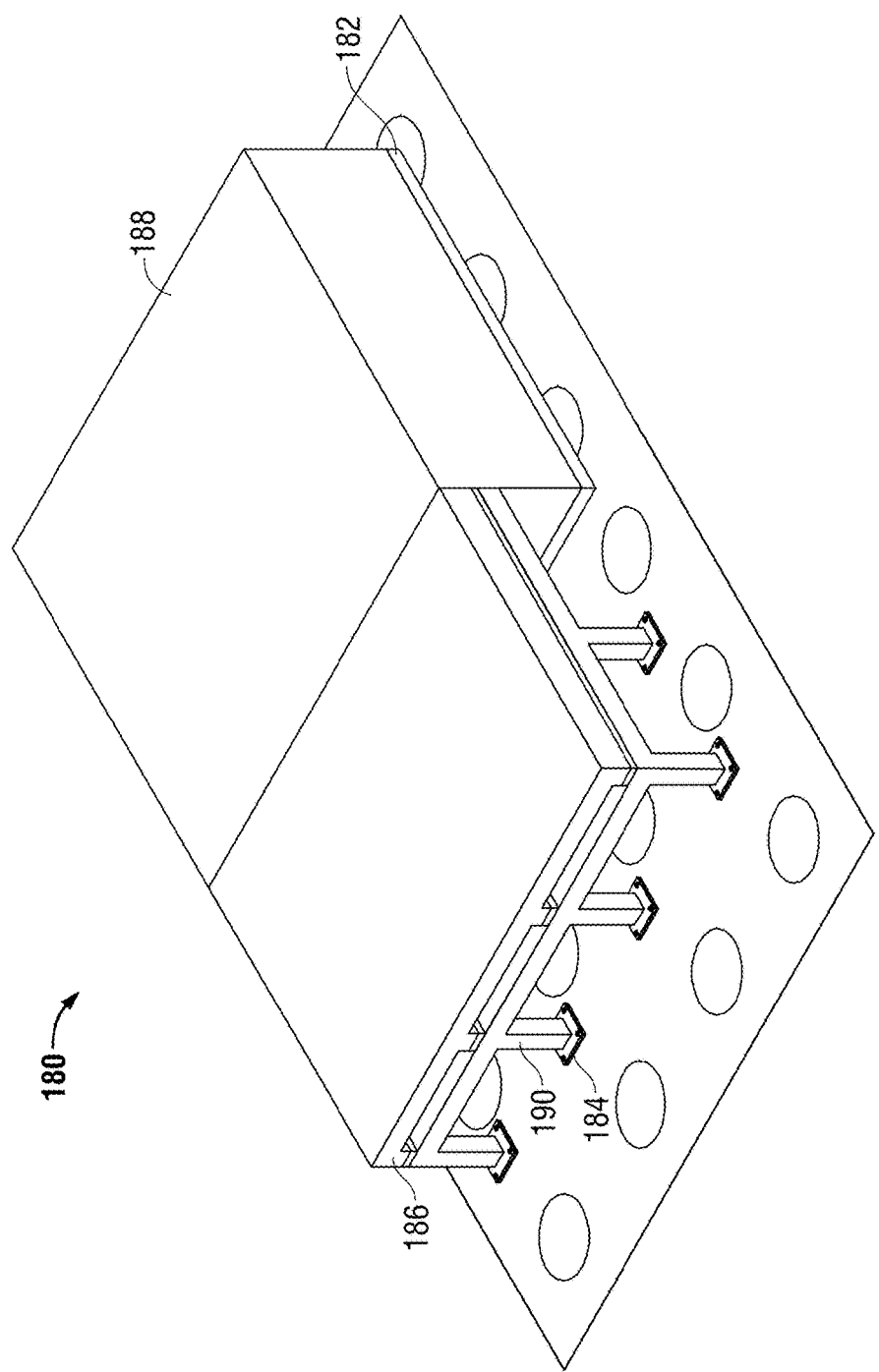
FIG. 11 provides a 3D view of a concrete tool pedestal employing teachings of the present disclosure.

FIG. 11 shows a 3D view and example of concrete tool pedestal 188 next to metal type tool pedestal/pad 190, multiple perforated spacers 184 forming layered dampeners with sound proofing/dampening adhesive/caulk in the voided spaces and simple hybrid dampener of perforated spacer 186 with sound proofing/dampening adhesive/caulk at point of contact (hybrid dampener), set in clean room with waffle floor.

Figure 12:
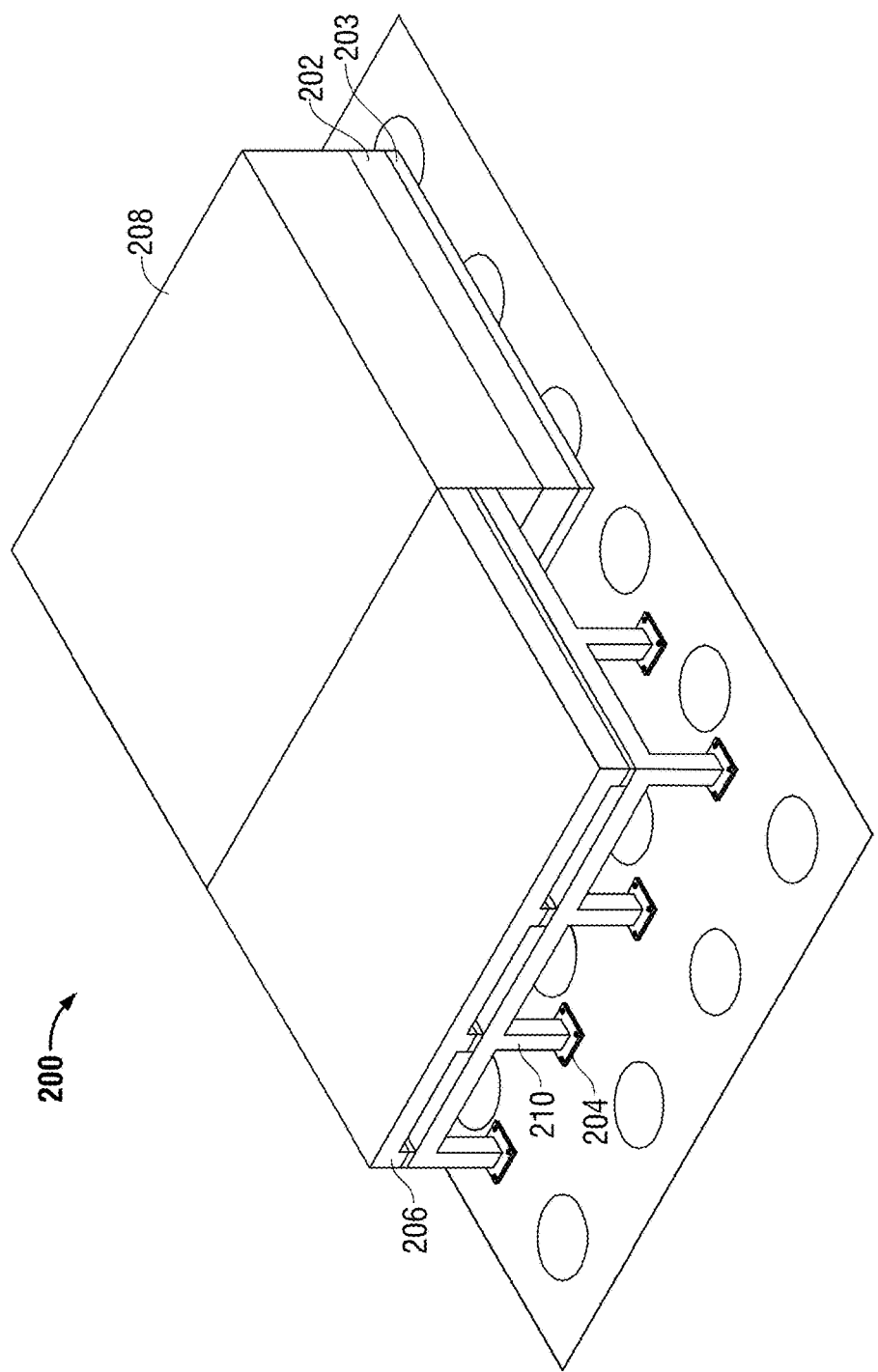
FIG. 12 shows a concrete and porous high strength metal combined to make hybrid tool pedestal/pad exhibiting teachings of the present disclosure.

FIG. 12 provides a view of concrete 208 and porous high strength metal 210 combined to make hybrid tool pedestal/pad 203 serving as a layered hybrid dampener, including multiple perforated spacers with sound proofing/dampening adhesive/caulk and 206 serving as a simple hybrid dampener perforated spacer with sound proofing/dampening adhesive/caulk at point of contact serving as a hybrid dampener, set in clean room with waffle floor. Hybrid tool pedestal/pad, consist of concrete and high strength porous metal with hybrid composite dampener.

With the present discloser there may be different configurations for placement/position of vibration isolation mater, to include all sides, for concrete, porous high strength metal, type of steel layer and hybrid dampening spacer, may be placed in different sequence of layers. Such examples may address the need for a low center of gravity, high porous high strength metal which may be on top of concrete to include type of steel added to the bottom for added weight. According to the type of production equipment, contact surface, or location of equipment need within the production area may dictate the position and location of concrete, porous high strength metal, steel plating and hybrid dampening spacer in different sequence and positions.

Using a porous metal with high strength provides excellent vibration reduction performance. Aluminum and its alloys offer a wide range of properties that can be engineered precisely to the demands of specific applications, such as in aerospace, advanced nuclear reactors, surface coating and metal/air batteries, through the choice of alloy, temper condition and fabrication process. By utilizing various combinations of its advantageous properties such as strength, lightness, corrosion resistance, recyclability and formability, aluminum is being employed in an ever-increasing number of applications. The methods and teachings of the present disclosure provide one such application for which five thousand series or six thousand series Aluminum alloy, such as 5083 or 6061 or 6062 work-hardened (H) or heat-treated (T) may be desirable for both vibration reduction and weight bearing.

Referring to FIGS. 11 through 15, perforated metal can be cut to different sizes. Due to differences in table/platform with legs, the tool pedestal/pad is sitting on waffle floor in the process level. The following figures show how the present teachings address the requirement of platforms to be formed in different configurations. Accordingly, modifications to perforated metal designs include the placement of sound dampening caulk in the voided spaces and sandwiching or by any other means are considered within the teachings of the present disclosure. Perforated metals with different size voids (overlapping between the metal layers) filled with sound dampening adhesive caulk (creating hybrid vibration dampening/isolation barrier), may be layered with up to vibration dampening or isolation, as needed, and be well within the present scope. That is, high strength porous metal may be on top or bottom or middle or any combination thereof. Examples of such configurations now follow.

Figure 13:
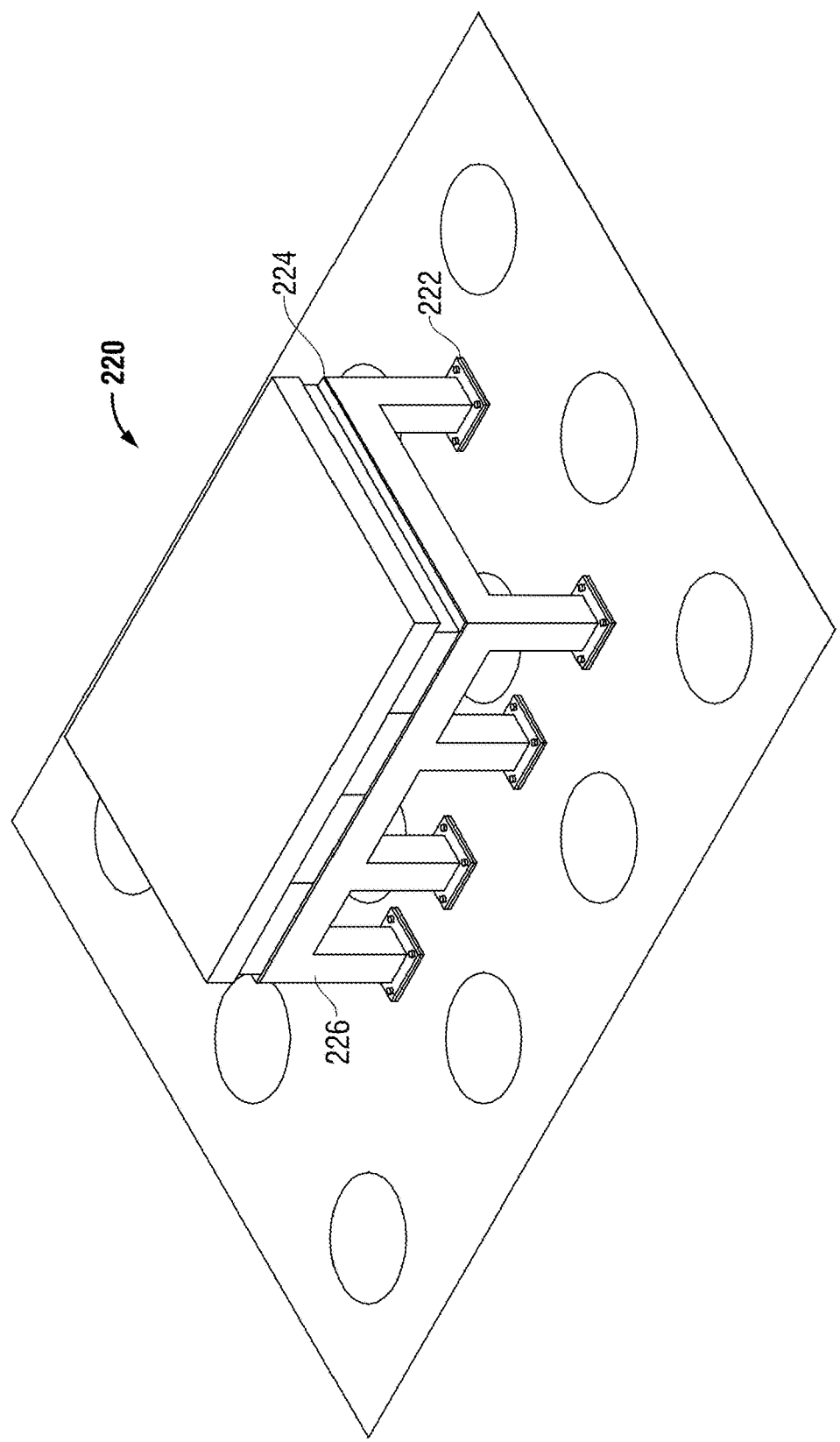
FIG. 13 is 3-D view of a concrete encased in metal type tool pedestal/pad with multiple perforated spacers according to teachings of the present disclosure.

FIG. 13 is 3-D view of concrete encased in metal type tool pedestal/pad 226 and layered hybrid dampener) multiple perforated spacers 222 with soundproofing/dampening adhesive/caulk and simple hybrid dampener) perforated spacer 224 with soundproofing/dampening adhesive/caulk at point of contact, set in clean room with waffle floor.

Figure 14:
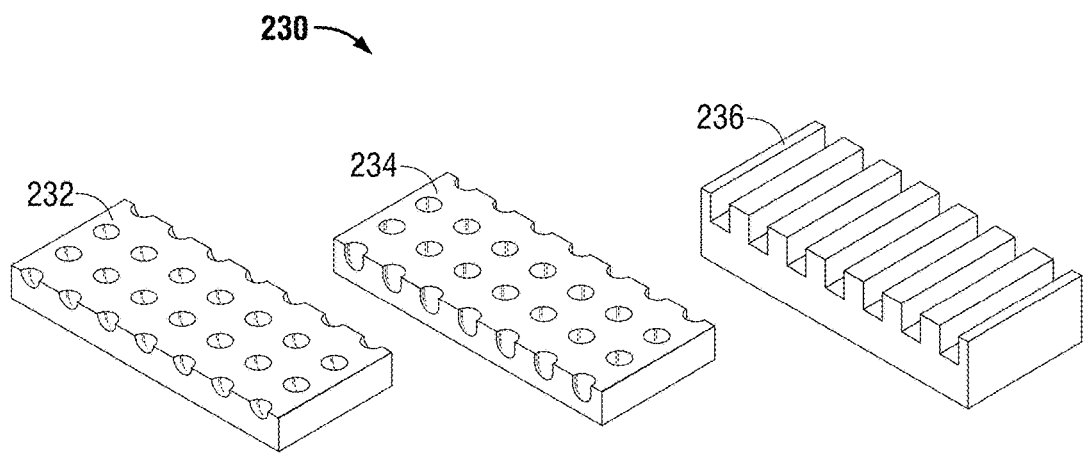
FIG. 14 shows a 3-D view of a high strength porous metal structure with voided spaces according aspects of the present disclosure.

FIG. 14 is 3-D view of examples 230, including examples 232, 234, and 236, of high strength porous metal with voided spaces filled with soundproofing/dampening adhesive/caulk in voided area. Both the size of void spaces, pattern and thickness varies for type of applications wherein such porous metals may be used for the desired vibration isolation.

Figure 15:
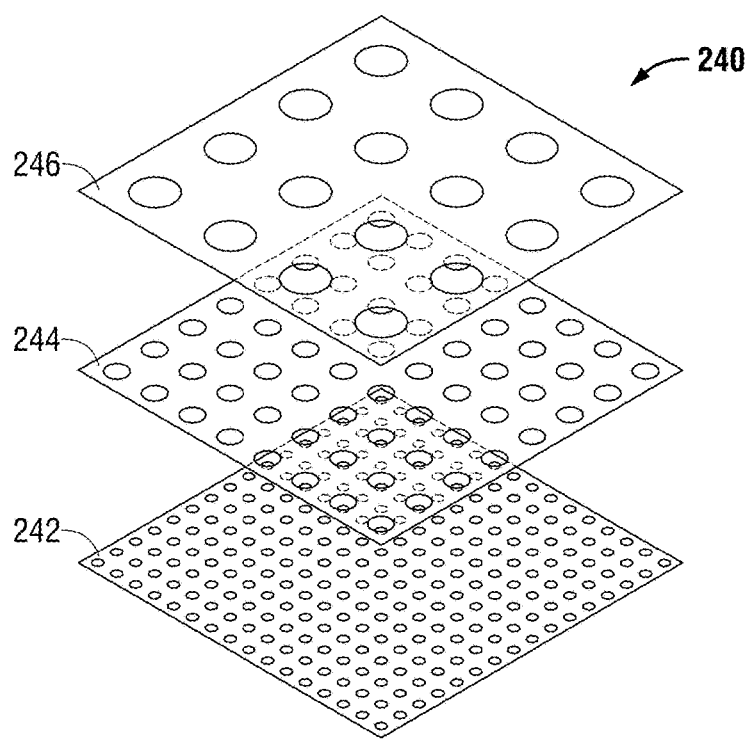
FIG. 15 provides a 3-D view of multiple layers of perforated high strength porous metal according to the present disclosure.

FIG. 15 is 3-D view of examples 240, including examples 242, 244, and 246 of multiple layered hybrid dampener layers of perforated high strength porous metal filled with soundproofing/dampening adhesive/caulk in voided area. Note that the size, shape of void spaces, pattern and thickness may vary for different types of applications.

Perforated metal spacers formed from materials such as examples 240 may be made from high strength porous metal, including five thousand series or six thousand series Aluminum alloy, such as 5083 or 6061 or 6062 work-hardened (H) or heat-treated (T). With such materials, void spaces may be filled with with sound dampening acoustical adhesive/caulk. If needed, metal spacers may be double layered with different size openings to over lap the bottom or other plate for better combined exposure to better sound dampening material (acoustical adhesive/caulk). And since it is the perforated high strength metal, it can be tightened down. Also material to include the metal is non corrosive with negative ion properties.

An important aspect of the present disclosure includes the use of a rubbery material with sound dampening characteristics. However, a rubbery gasket alone provides an insufficient design. The rubber gasket is insufficient because of the movement and compressibility associated with pure rubber or elastic material. Movement and compressibility is unacceptable for semiconductor production, because movement affects lithographic accuracy and deposition alignment. Instead, the present disclosure provides the vibration isolation aspect of a rubbery or elastic material, as well as the necessary strength and lack or movement/compressibility. High strength porous metal finds attractive use in the subject disclosure, because it avoids compressibility. Moreover, by filling void spaces areas with sound dampening materials certain advantages arise. The present subject matter makes novel use of different sized perforated spacings. As such, overlapping voided spaces prevent metal-on-metal contact. Preventing metal-on-metal contact avoids or substantially reduces any possible direct vibration conduction path. The result becomes a marked improvement in vibration isolation for even the most delicate semiconductor device processes.

The present disclosure provides a fundamentally different type of anti vibration pad from ones within the prior art. All anti vibration pads are compressible, semi rigged (firm to certain point and/or expensive active controlled) which is not cost feasible for the whole FAB. The vibration isolation pad of the present disclosure provides a different design.

Figure 16:
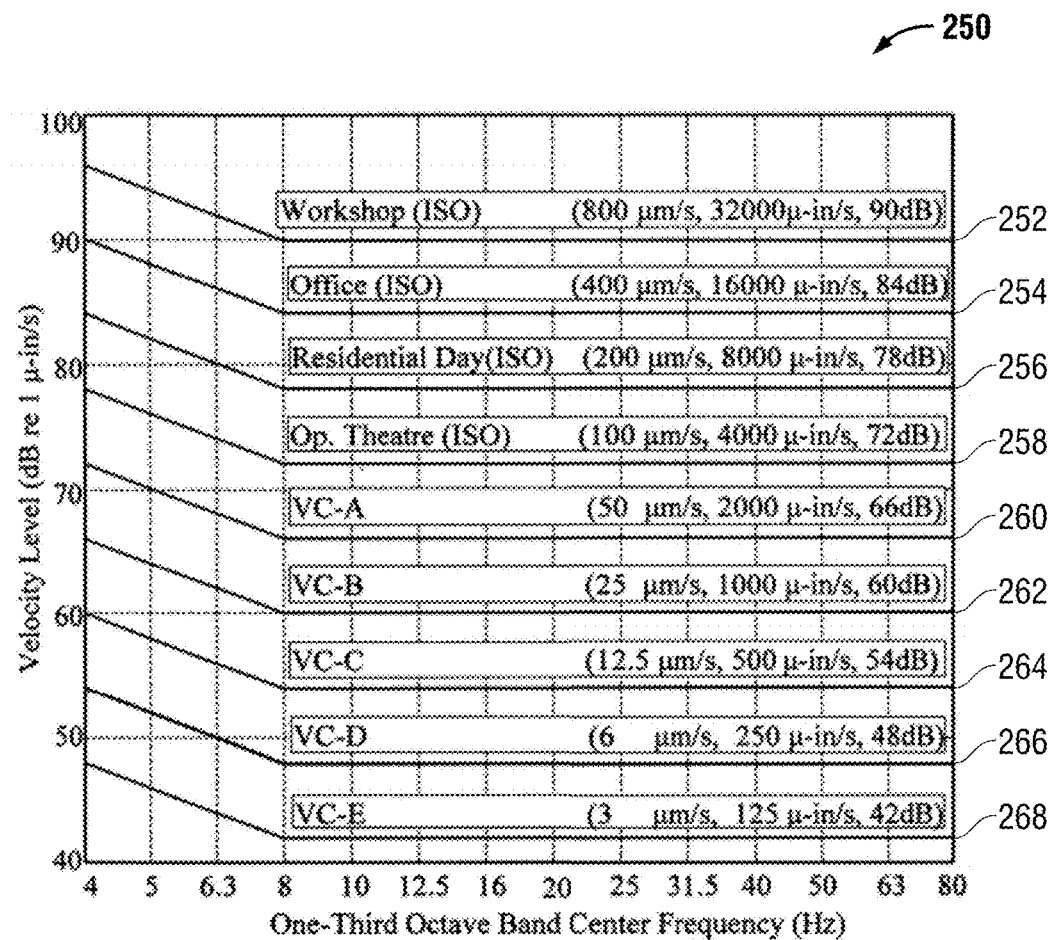
FIG. 16 presents a table plotting vibration velocity levels against one-third octave band frequencies to show various equipment vibration standard for the subject matter other present disclosure.

To explain the difference, consider FIG. 16, which shows different vibration isolation standards for different environments. FIG. 16 shows plot 250 of Velocity Levels in dB re 1 μ-in/s against One-Third Octave Band Center Frequency (Hz) for various vibration standards. Thus, Workshop (ISO) standard 252 ranging from 8 Hz to 80 Hz at a level of 90 dB re 1 μ-in/s. Other standards include Office (ISO) level 254, Residential Day (ISO) standard 256, Op. Theatre (ISO) 258, and then standards VC-A 260, VC-B 262, VC-C 264, VC-D 266, and VC-E 268. Note that standard VC-E 268 is the most stringent requirement, at 3 μm/s, 123, 125 μ-in/s, and 42 dB.

For most semiconductor fabrication facility applications, such as 14 nm and 10 nm facilities, specifying the VC-D 266 level of vibration isolation is sufficient. However, for production critical tools, industry standards are likely to be at the VC-E 268 level, in the future. However, no fully populated FAB presently meets the VC-E 268 standard. For 7 nm, 5 nm & 3 nm standard, VC-E 268 may be demanded facility-wide or at least in critical areas. Accordingly, the present teachings provide the ability to minimize/reduce or isolate vibration, much as possible, but with time and cost effectiveness.

On the vibration question, VC-D 266 provides a satisfactory starting point for the semiconductor processing equipment fabrication vibration regime. Due to small nanometer critical dimension process requirements, the semiconductor industry may soon demand specifying VC-E 268. Unfortunately, no fully populated fabrication facility meets such a requirement. Some manufacturers may even extend their criteria up to 250 Hz, but typically the lower frequencies are more detrimental to fabrication processes. According, the present disclosure provides a highly practical, valuable, and extraordinarily effective way to satisfy both current and future vibration reduction/elimination requirements.

Transmission of vibration from waffle floor to tool pedestal system in semiconductor FABs depends on several parameters, such as forcing frequency, mass, stiffness, energy absorption mechanism, etc. The primary source of vibration of the supporting systems includes the vibration of pumps, compressors, etc. attached below the waffle clean room floor, worker's activities and vibration generated by other machines operating on the waffle floor, and many others. As the industry is evolving toward single digit nanometer FABs, the requirements for limiting vibration are becoming stricter to ascertain reliable and uninterrupted operation. Research and development of efficient vibration isolation mechanism is also becoming increasingly popular as the traditionally used tool pedestal systems are needing improvement for meeting the vibration tolerance requirements. Certain tool pedestal systems have attached mass block (often made of concrete) for supporting top-heavy semiconductor fabrication tools. To meet the requirements for vibration isolation, these blocks can be built to have composite masses having metal plate at bottom and high-strength reinforced concrete block mechanically fastened at the top of the metal plate. The whole composite block can rest on the waffle floor using a thin layer of sound dampening adhesive. The use of composite mass block in such a hybrid tool pedestal system efficiently acts as a vibration barrier by lowering the frequency content to approximately 140 Hz or lower for an inducing frequency content of up to 240 Hz.

As Semiconductor chip production node size decrease in size. Vibration contributes to lower production yield rate in semiconductor chip production. For major chip manufacturer to build a new FAB for new vibration requirements would cost over one billion dollars per FAB with separate facility for Ultra Purified Water (UPW), and would take over one year with project being on a "fast track construction". Along with cost effectiveness and vibration reduction/isolation, ease of material handling and installation is needed for cutting Tool Ramp Up and remodel/modernization of FAB to minimize construction down time. As a semiconductor chip node size decreases to single digit nanometer, list of tool pedestal requiring higher requirements for stiffness, isolation/reduction of vibration are increasing.

Lithography tool pedestal which requires higher requirements, Chemical-Mechanical Planarization (CMP) tool and Analysis tool pedestal has increase stiffness and vibration requirements. In addition, a chip node size decreases in to single digit nanometer, other support tools such as Etching Tool (Wet or Dry), Chemical Vapor Deposition (CVD) tool, Physical Vapor Deposition (PVD) tool, New support tools requires new specification for vibration and stiffness.

Support tools generally relied on built in passive vibration reduction system within device. Support tool pedestals are made of stainless steel, aluminum or steel coated with epoxy or powder coated. Some support tool pedestals are mounted on top of existing adjustable height floor pedestal system, with just steel "I" beam or steel tubing for sublevel support. Increased size, weight and MEP penetration access holes have increased, which contributes to loss of tool pedestal/pad stiffness and increase in vibration. Stiffeners, which could be welded around each MEP access penetration openings on the bottom of tool pedestals, which requires increases fabrication time and cost. For some tools, MEP access penetration openings are so large, welded stiffeners is not enough to cope with tool pedestal deflection and vibration. Another way has been, using thicker metal for tool pedestals, however, added weight creates material handling issues, increase installation time and need for upgrading adjustable floor pedestal. Prolong construction within semiconductor adds to vibration problem, and possible production yield loss.

Requirements for semiconductor processing equipment connection details to tool pedestal, recessed or surface mounted, determined per equipment manufacturer. Vibration causes deflection and deflection causes damaging effects to costly high-precision machine tools. The basic idea of the following embodiments includes the suppression of the transmission of vibration from the supporting system to machine tools.

Figure 17:
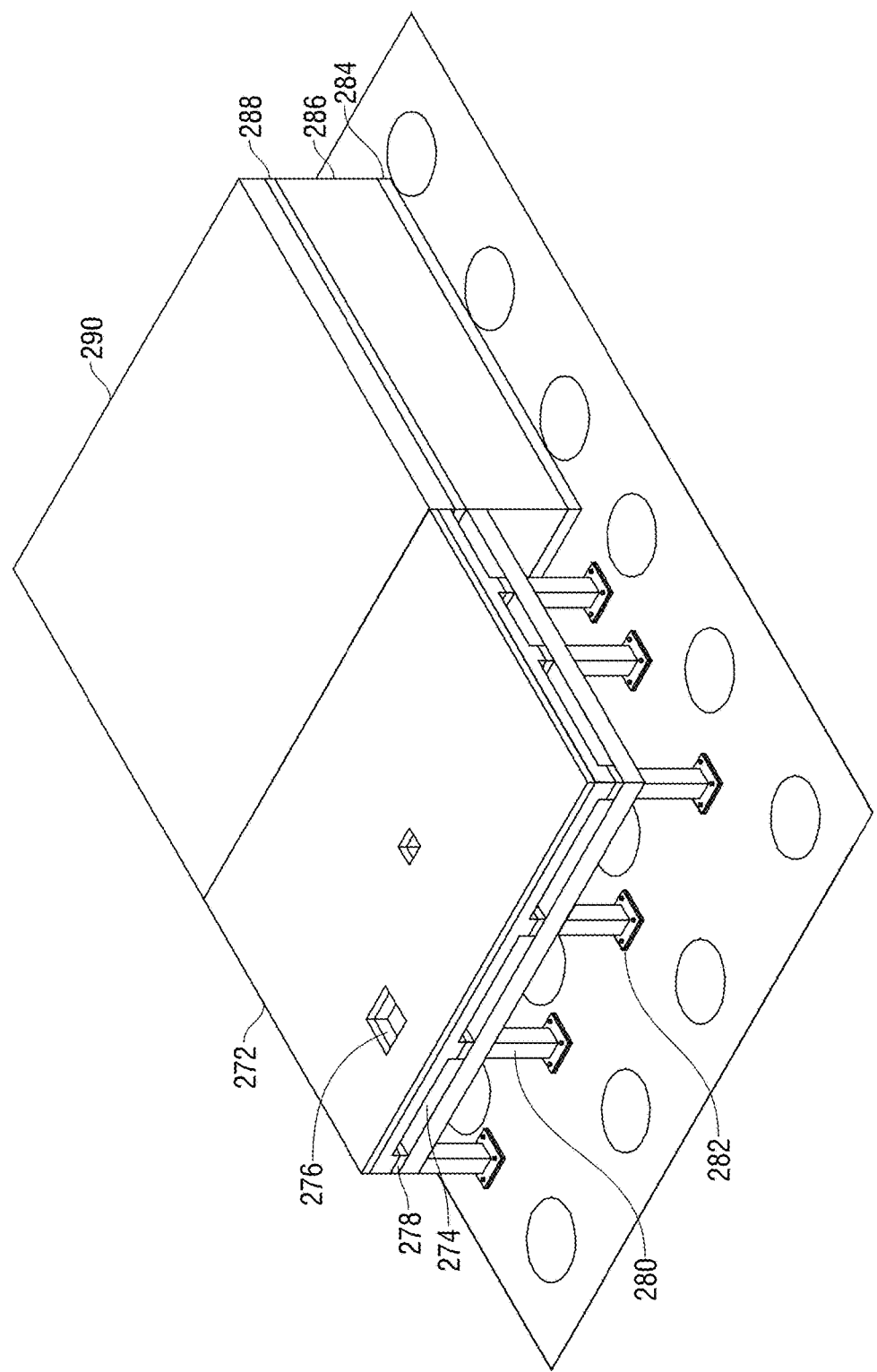
FIG. 17 shows an example of machine tool pedestal supporting system sitting on a waffle clean room floor.

FIG. 17 shows an example of machine tool pedestal supporting system sitting on a waffle clean room floor 270. The left part of the system is an assembly of metallic pedestal, beam and plates, in which, porous high-strength metal plate 272 is mechanically bonded to solid metal plate 274. Modern tool pedestal systems often have multiple MEP access openings 276, causing localized reduction in stiffness. The composite floor plate is envisioned to circumvent this stiffness reduction. Below the composite plate, there is perforated porous high-strength metal with sound-dampening adhesive in voided area 278 acting as the barrier in the vibration transmission between the metal pedestals legs 280 and the composite plate 272 and 274. The legs of metal pedestal 280 rest on the waffle floor 270 by using thin layers of sound dampening adhesive 282 below the base metal plates.

The right part of the system is a composite block of heavy mass which is meant to absorb all frequencies of vibration transmitted from waffle clean room floor 270. The four components from bottom to top in the heavy mass block are a layer of sound dampening adhesive 284, a reinforced concrete block 286, another layer of sound dampening adhesive 288, and a block of porous high strength metal 290. The first layer of sound dampening adhesive 284 between waffle clean room floor 270 and concrete block 286 will cause immediate reduction in the vibration induced deflection from clean room floor 270 to concrete block 286. The second layer of sound dampening adhesive 288 will further reduce deflection transmitted from concrete block 286 to the porous high strength metal block 290. Overall, the deflection carried from waffle concrete floor 270 to machine tool through these various layers will be significantly low, and thus an effective isolation will be achieved.

Figure 18:
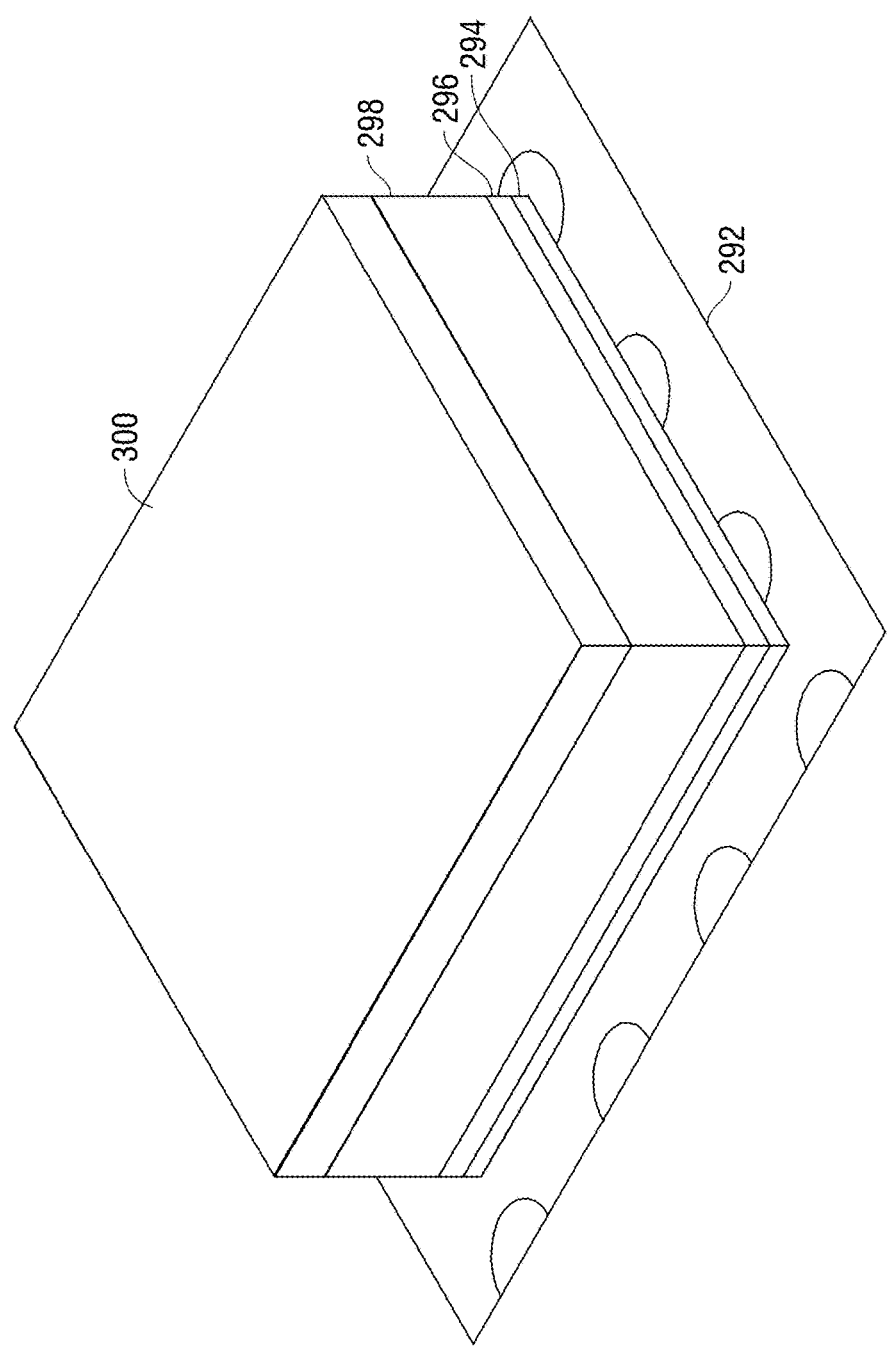
FIG. 18 shows modifications to the example FIG. 17.

The composite block shown in FIG. 17 needs modification for top-heavy semiconductor fabrication tool pedestal system. FIG. 18 shows the modifications to FIG. 17. The composite block consists of a thick metal plate 296 and a porous high-strength metal plate 300, mechanically fastened at the bottom and top, respectively, of a high-strength concrete block 298. The composite block sits on the waffle clean room floor 292 by using one layer of sound dampening adhesive 294.

Figure 19:
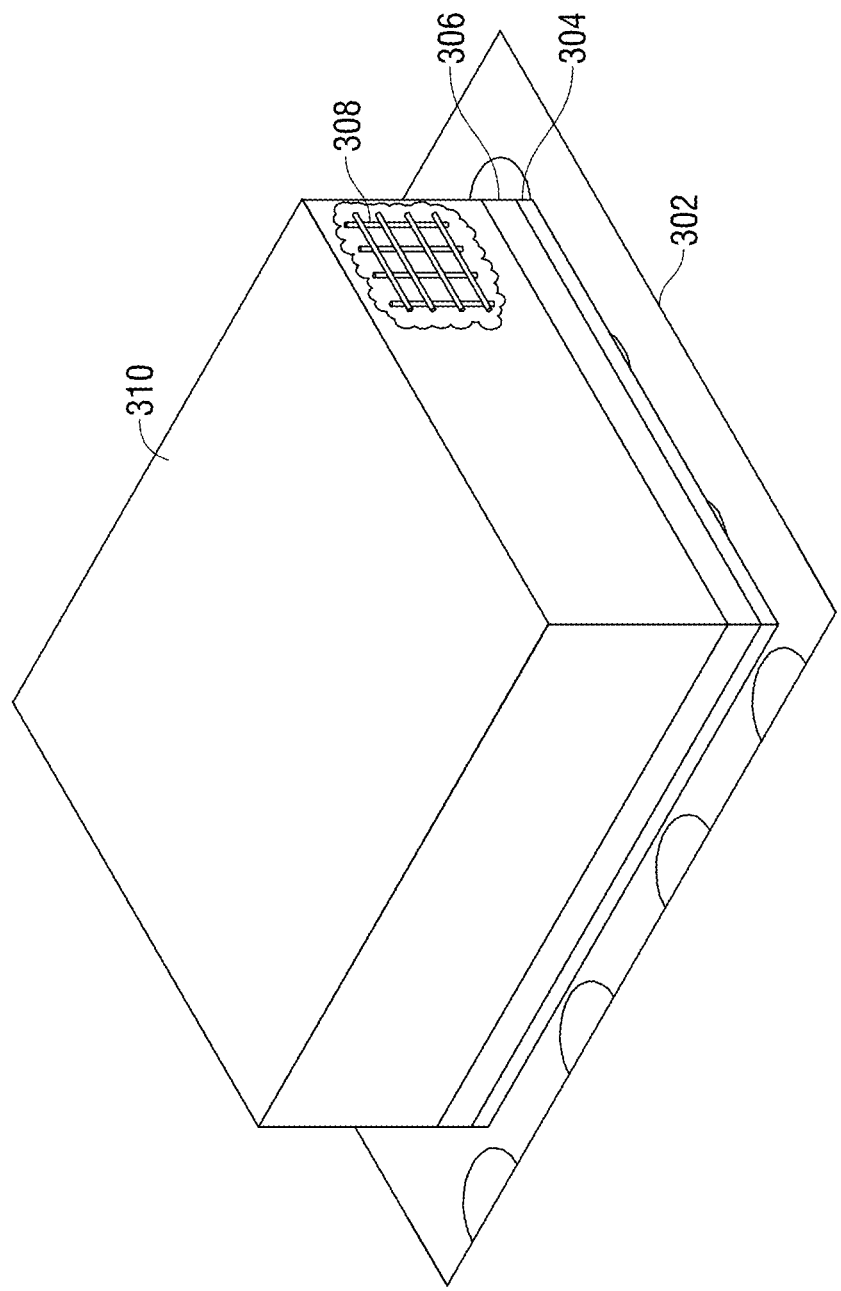
FIG. 19 is another form of composite block for top-heavy semiconductor fabrication tool pedestal system.

FIG. 19 is another form of composite block for top-heavy semiconductor fabrication tool pedestal system. The composite block is made of high-strength reinforced concrete 308 infill with high-strength porous metal cover plates 310 on all sides except the bottom. A stainless steel plate 306 is attached at the bottom to keep the overall weight concentrated close to the waffle clean room floor 302. The composite block rests on the concrete floor using a layer of sound dampening adhesive 304.

Figure 20:
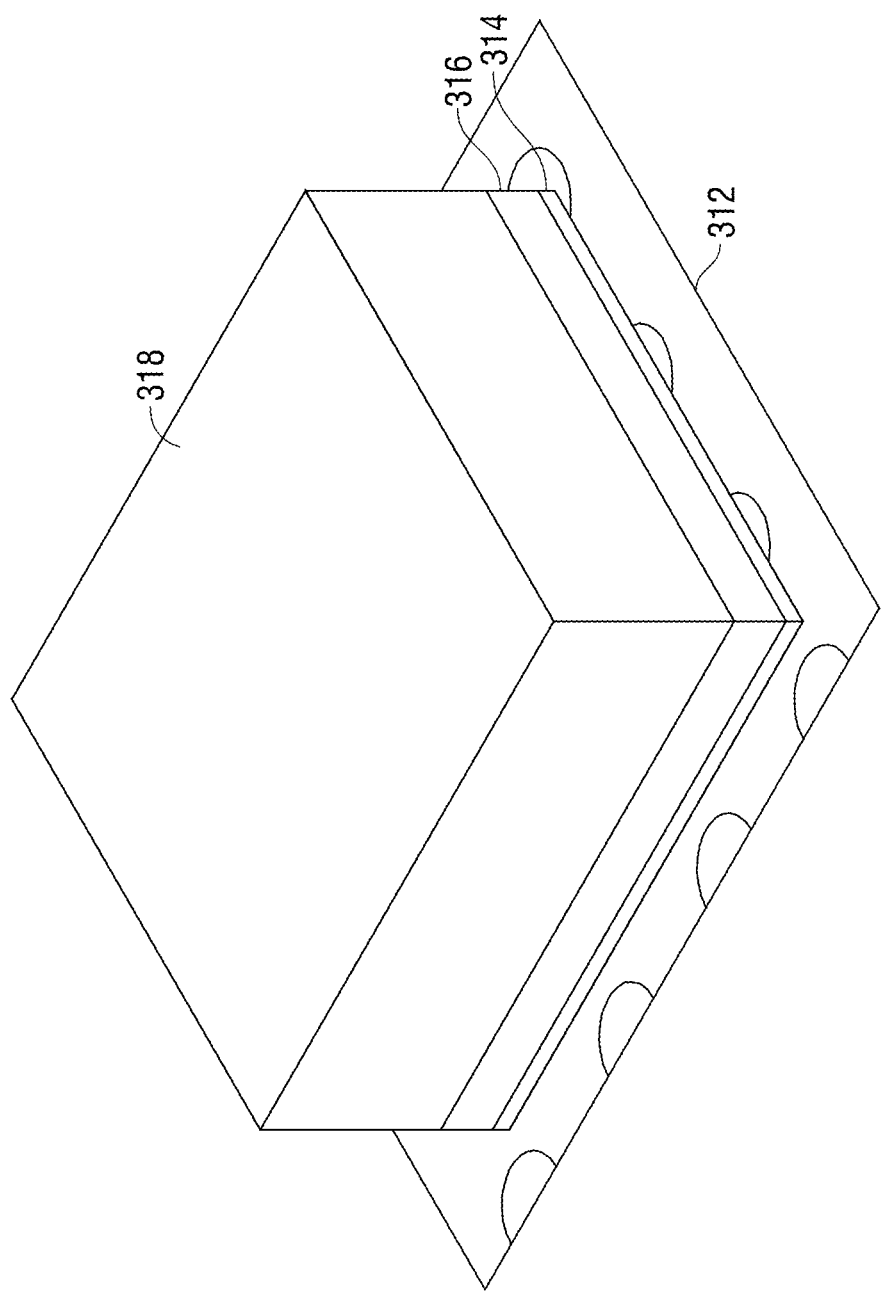
FIG. 20 is another form of composite block for top-heavy semiconductor fabrication tool pedestal system.

FIG. 20 is another form of composite block for top-heavy semiconductor fabrication tool pedestal system. The composite block in this case consists of a thick metal plate 316 mechanically fastened at the bottom of a high-strength concrete block 318. The composite block sits on the waffle clean room floor 312 by using one layer of sound dampening adhesive 314.

Figure 21:
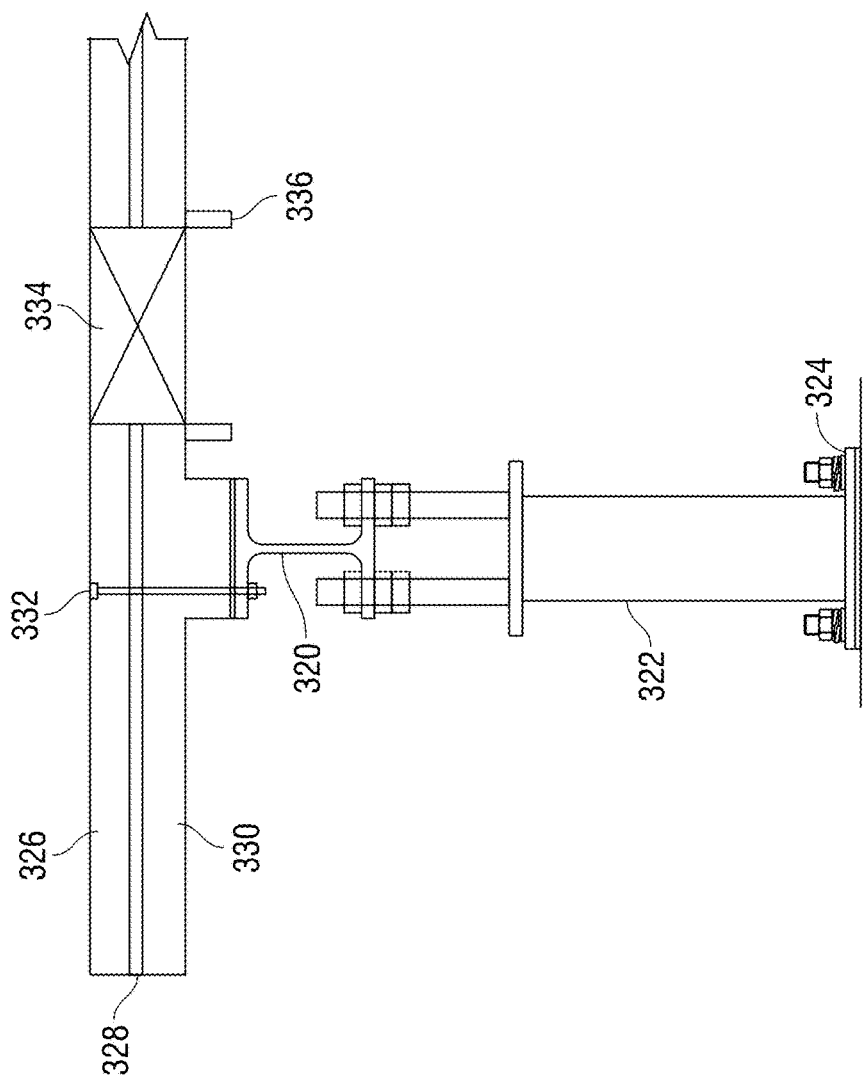
FIG. 21 shows a semiconductor fabrication tool pedestal system to provide a stable structural mechanism.

FIG. 21 shows a semiconductor fabrication tool pedestal system to provide a stable structural mechanism. The bottom part of the pedestal system consists of I-beams 320 and adjustable pedestal bases 322 sitting on concrete slab by using a layer of sound dampening adhesive 324. A sandwich composite metal floor having porous high-strength metal 326 at top, steel metal pad 330 at bottom, and a layer of sound dampening adhesive 328 in between. The composite floor is fastened to I-beam by means of mechanical fastening bolts 332. The floor may often have penetration holes 334 for MEP access. Deflection strips 336 are provided around the holes to circumvent the stiffness reduction around the opening.

Figure 22:
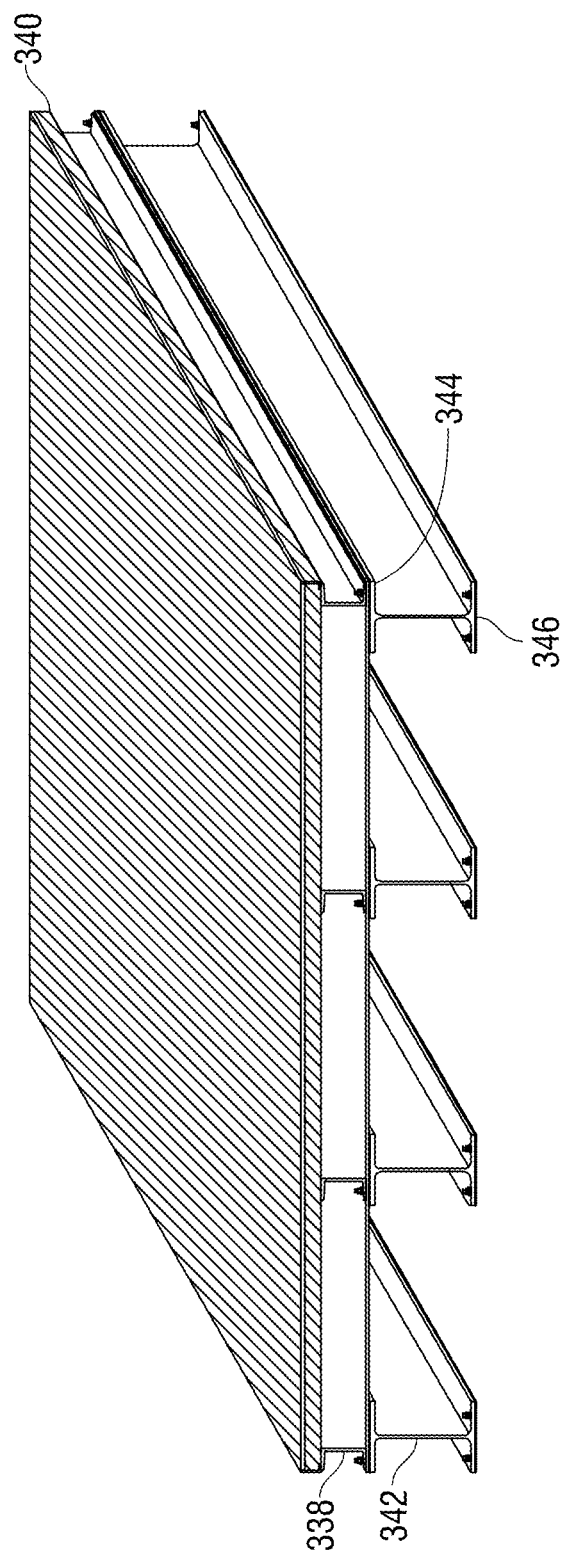
FIG. 22 is an example showing flooring system having reinforced concrete poured inside metallic channel pan and covered with aluminum plate on top.

FIG. 22 is an example showing flooring system having reinforced concrete 338 poured inside metallic channel pan and covered with aluminum plate on top 340. The floor system is supported on I-beams 342 used as alternative tool pedestal base. A layer of sound dampening adhesive 344 over the flanges and another layer of sound dampening adhesive 346 below the flanges of the I-beams are used to control the vibration induced deflection. Overall, vibration induced deflections experienced at the top of floor is expected to be very low as the sound dampening adhesive will absorb most of the vibration energy.

Hybrid Tool Pedestal have multiple layers of metals and may contain particles (type of metal, thickness and density differ for different range of EMI frequencies) combined with concrete, meeting the barrier requirements from EMI below tool pedestal as well as to meet proper specification of stiffness, mass, and vibration isolation. Along with EMI barrier requirements, Hybrid Tool Pedestal manufactured using welded/fabricated metal shall also be degaussed to remove magnetic arc blow. Usually there are different welded attachments, reinforcements and angles of material welded throughout tool pedestals. Ferromagnetic metals can easily develop magnetism, which should be degaussed by using Yok, Prod or Degaussing Machine after welding fabrication and prior to incorporating with other materials, essentially making a Hybrid Tool Pedestal system with EMI barrier.

Hybrid tool pedestal system with mixed use of different types and thicknesses of materials, such as HS aluminum, high strength (HS) concrete reinforcing rebar (may include metal particles, EMI insulation or absorbing material added to concrete mix), steel or stainless steel, also degaussing process after fabrication to remove magnetic arc blow to create hybrid tool pedestal with EMI Barrier. Hybrid tool pedestal with EMI barrier with specified stiffness and vibration isolation with barrier from EMI frequencies from below tool pedestal.

Figure 23:
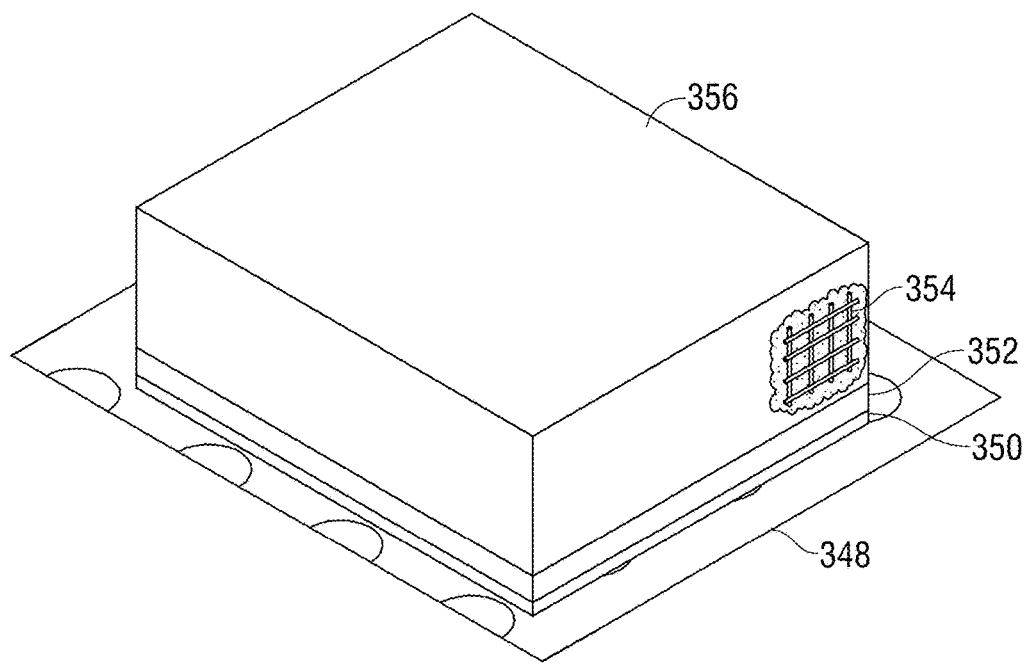
FIG. 23 shows a composite block of HS concrete reinforcing rebar over a steel plate and fastened to a semiconductor clean room waffle clean room floor.

FIG. 23 shows composite block 356 of HS concrete reinforcing rebar, which may include metal particles, EMI insulation or absorbing material added to concrete mix 354 over steel plate 352 and mechanically or chemically fastened to semiconductor clean room waffle clean room floor 348 by using one layer of sound dampening adhesive 350.

Figure 24:
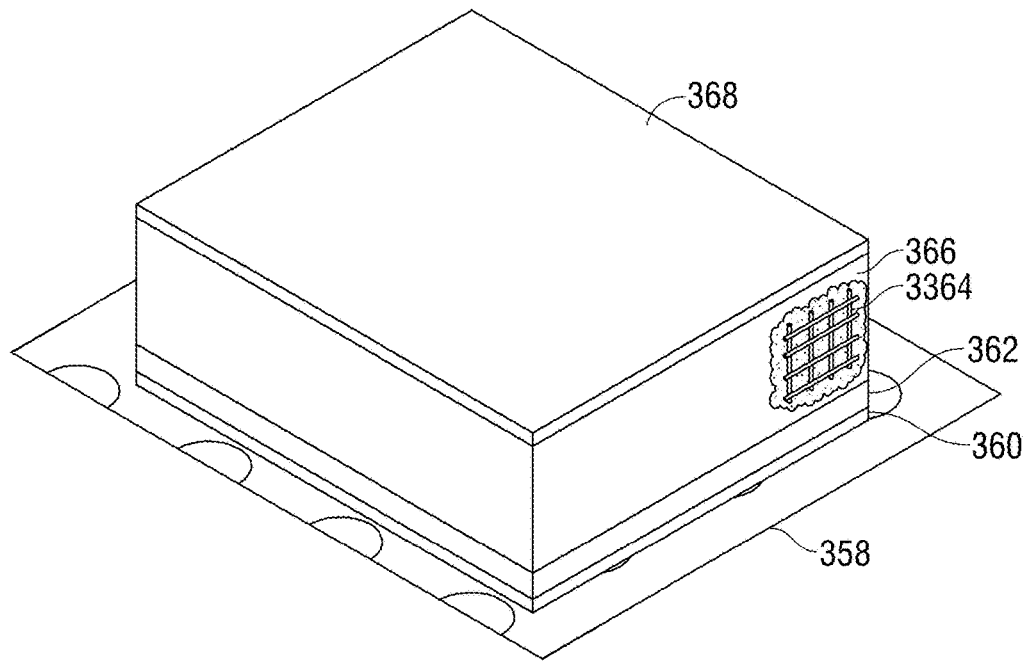
FIG. 24 high strength aluminum on top of the composite block over steel plate and fastened to a semiconductor clean room waffle clean room floor.

FIG. 24 presents high strength aluminum 368 on top of composite block 366 formed of HS concrete reinforcing rebar, which may include metal particles, EMI insulation or absorbing material, added to concrete mix 364 over steel plate 362 and mechanically or chemically fastened to semiconductor clean room waffle clean room floor 358 by using one layer of sound dampening adhesive 360.

In summary, the present disclosure provides a method, system, and fabrication facility that eliminates or substantially reduces process-limiting vibrations within a high-precision device manufacturing facility, wherein an elevated structure supports high-precision device manufacturing equipment and provides vibration reduction spacing between a floor and an upper surface of said elevated structure. The method comprises the steps of separating a base of the elevated structure from the floor using a first vibration isolation pad structure. A vibration absorbing foam fills a hollow portion of a vertical support structure separating the base from said upper surface. A second vibration isolation pad structure separates the vertical support structure from the upper structure of the elevated structure. In the present disclosure, the first vibration isolation pad structure, the vibration absorbing foam, and the second isolation pad structure coordinate to eliminate or substantially reduce the ability of vibrations from the floor to reach high-precision device manufacturing equipment operating on the upper surface of said elevated structure. The structure may further include an EMI insulation or absorbing material added to concrete mix, steel or stainless steel, as well as undergo a degaussing process after fabrication to remove magnetic arc blow to create hybrid tool pedestal with EMI Barrier.

Technical advantages of the present disclosure include providing a hybrid system for eliminating/substantially reducing both high frequency vibrations and low frequency vibrations. High frequency vibrations may be considered, for example, Workshop (ISO), Office (ISO), Residential Day (ISO), and Operating Theatre (ISO) ranges of vibration, as defined here by the chart of FIG. 16. Low frequency vibrations may be considered those vibrations classified as VC-C, VC-D, and VC-E in FIG. 16. The teachings of the present disclosure provide the ability to establish an environment operating in the range of VC-E.

The disclosed method and system include the use of dedicated MEP (mechanical, electrical, plumbing) support pedestals, only attach as support for MEP lines, as to improve isolation of low frequency vibration. With minimal weight increased for material for ease of material handling and installation, this method is intended for tools without specifically vibration frequency dampened and isolation designed tool pedestals and pads; which only relied on it's built in passive vibration isolation systems. Reduction and isolation of vibration frequencies for improving production yields as semiconductor chip design is advancing in smaller nanometer critical dimensions for semiconductor device processing.

The disclosed vibration isolation structures in addition to industry standard structures such as construction isolation joints, miniature damping pads between raised floor tiles to pedestal, and vibration isolation connectors for MEP lines. Moreover, the improved isolation of vibration frequencies transmitted through building structure to achieve better production yield rates.

The method and system of the present disclosure are economical, schedule driven and impose minimal weight in the construction of material handling and installation facilities for nanometer-scale semiconductor fabrication facilities and similar high precision lithography and fabrication environments. As a result of the present teachings, semiconductor fabrication yields and process efficiencies greatly improve.

The present method and system eliminate or substantially reduce low frequency vibrations which affect production tools such as lithograph tools, so as to increase lithographic accuracy and yield percentages in semiconductor device fabrication. Accordingly, the effects from vibration sources, such as foot traffic over raised floor system, pumps, compressors, chillers and AHUs (air handling units) that produce low vibration frequencies transmitted through building and clean room floor structures.

The present disclosure includes the ability to allow newer semiconductor production tools having tighter vibration frequency requirements to operate effectively in conjunction with older support tools with outdated vibration specifications. The ability to extend older equipment useful live may result in process expense reductions and greater operational profits for semiconductor device fabrication facilities. The disclosed design permits vibration isolation without having to modify entire structures, as well as with minimal overall weight variations as a result of vibration isolation modifications.

The present disclosure permits installation of composite foam within structural components rapidly and as little as one-day disruption in fabrication facility operations. As a result, the significant improvements of the present subject matter afford major operational and efficiency improvements with a most economical set of structural transformations to increase overall fabrication facility profitability and efficiency. The disclosed subject matter avoids the enormous expense of replacing all old support tools with new ones having vibration specification matching new key production tools.

The detailed description set forth herein in connection with the appended drawings is intended as a description of exemplary embodiments in which the presently disclosed subject matter may be practiced. The term "exemplary" used throughout this description means "serving as an example, instance, or illustration," and should not necessarily be construed as preferred or advantageous over other embodiments.

This detailed description of illustrative embodiments includes specific details for providing a thorough understanding of the presently disclosed subject matter. However, it will be apparent to those skilled in the art that the presently disclosed subject matter may be practiced without these specific details. In some instances, well-known structures and devices are shown in block diagram form in order to avoid obscuring the concepts of the presently disclosed method and system.

The foregoing description of embodiments is provided to enable any person skilled in the art to make and use the subject matter. Various modifications to these embodiments will be readily apparent to those skilled in the art, and the novel principles and subject matter disclosed herein may be applied to other embodiments without the use of the innovative faculty. The claimed subject matter set forth in the claims is not intended to be limited to the embodiments shown herein, but is to be accorded the widest scope consistent with the principles and novel features disclosed herein. It is contemplated that additional embodiments are within the spirit and true scope of the disclosed subject matter.

What is claimed is:

1. A method for eliminating or substantially reducing process-inhibiting vibrations within a high-precision semiconductor device fabrication facility, comprising the steps of:
    supporting a high-precision semiconductor device fabrication equipment on a hybrid tool pedestal system within a building having a building structure susceptible to vibration transmission and that may be exposed to and susceptible to transmitting process inhibiting vibrations to said high-precision semiconductor device fabrication equipment, wherein said hybrid tool pedestal system comprises a multi-layered material construction formed of materials selected for isolating varying vibration frequencies by virtue of the combined isolation of said multi-layered material construction;
    positioning said hybrid tool pedestal system on a raised floor, said raised floor for structurally separating a building floor from said hybrid tool pedestal system for providing a first portion of vibration isolation between the high-precision semiconductor device fabrication equipment and the building floor, said hybrid tool pedestal system comprising a plurality of base structures for positioning said hybrid tool pedestal system on said raised floor and an elevated structure for providing structural support and separating a high-precision semiconductor device fabrication equipment positioned on said elevated structure from said plurality of base structures;
    separating said plurality of base structures from said raised floor using a plurality of first vibration isolation pads, said plurality of first vibration isolation pads comprising an adhesive pad, caulking, or a combination of adhesive pads and caulking;
    positioning a plurality of first vertical support structures as a portion of said elevated structure and separating an upper structure of said elevated structure from at least selected ones of said plurality of base structures, said selected ones of said plurality of first vertical support structures further comprising a hollow portion capable of being filled;

filling at least a subset of said hollow portions with a vibration absorbing foam, said vertical support structure separating said base from said upper surface and further comprising concrete mix to reduce/isolate vibration and improve stiffness thereby absorbing vibrations transmitted to said first vertical support structures;

separating said plurality of first vertical support structures from said upper structure using a second vibration isolation pad comprising an adhesive pad, caulking, or a combination of adhesive pads and caulking;

wherein said first vibration isolation pads, said vibration absorbing foam, and said second vibration isolation pad coordinate to eliminate or substantially reduce the ability of vibrations from the building floor to reach high-precision semiconductor device fabrication equipment operating on said upper structure; and further separating said second isolation pad from said upper structure using a vertical structural beam, said vertical structural beam connecting to said upper structure at a first joint and to said second isolation pad at a second joint; and applying a vibration frequency isolation structure in the form of either an adhesive pad, caulking, or a combination of adhesive pad and caulking at said first joint for vibration isolating said upper structure from said vertical structural beam and at said second joint for vibration isolating said vertical structural beam from said second isolation pad for further preventing vibration isolating said semiconductor device fabrication process inhibiting vibrations at the building floor from affecting precision operation of the high-precision semiconductor device fabrication equipment on said upper structure, and associating a heavy mass block between said plurality of base structures and said raised floor for vibration and sound reduction said heavy mass block comprising a first layer of sound dampening adhesive, a reinforced concrete block connecting to said first layer of sound dampening adhesive, a second layer of sound dampening adhesive position on said reinforced concrete block opposite said first layer of sound dampening adhesive, and a block of porous high strength metal connecting to said second layer of sound dampening adhesive, said first layer of sound dampening adhesive positioned between a clean room floor and said reinforced concrete block for first reducing in the vibration induced deflection from the clean room floor to said concrete block, said second layer of sound dampening adhesive for further reducing deflection transmitted from said reinforced concrete block to said porous high strength metal block, wherein deflection and vibration carried from a waffle concrete floor to the high-precision semiconductor device fabrication equipment becomes effectively isolated; and further providing on said heavy mass block an electromagnetic interference (EMI) barrier for insulating or absorbing EMI for preventing EMI frequencies from adversely affecting operation of the high-precision semiconductor device fabrication equipment and further performing a degaussing step on said high-precision semiconductor device fabrication equipment for removing magnetic arc blow associated with said EMI barrier.

2. The method of claim 1, further comprising the steps of epoxy coating or powder coating with negative ion properties said vertical support structure for structural strength.

3. The method of claim 1, further comprising the step of isolating vibrations associated with MEP lines using a plurality of vibration isolation pedestal configurations to improve isolation of vibrations frequency transmitted MEP lines and through a building structure.

4. A system for eliminating or substantially reducing process-inhibiting vibrations within a high-precision semiconductor device fabrication facility, comprising:

a hybrid tool pedestal system supporting a high-precision semiconductor device fabrication equipment within a building having a building structure susceptible to vibration transmission and exposed to and susceptible to transmitting process-inhibiting vibrations;

said hybrid tool pedestal system for positioning on a raised floor for structurally separating said hybrid tool pedestal from a building floor for providing a first portion of vibration isolation between the high-precision semiconductor device fabrication equipment and the building floor, said hybrid tool pedestal system comprising a plurality of base structures for positioning said hybrid tool pedestal system on said raised floor and an elevated structure for providing structural support and separating a high-precision semiconductor device fabrication equipment positioned on said elevated structure from said plurality of base structures;

a plurality of first vibration isolation pads for separating said plurality of base structures from said raised floor, said plurality of first vibration isolation pads comprising an adhesive pad, caulking, or a combination of adhesive pads and caulking;

a plurality of first vertical support structures positioned as a portion of said elevated structure and separating an upper structure of said elevated structure from at least selected ones of said plurality of base structures, said selected ones of said plurality of first vertical support structures further comprising a hollow portion capable of being filled;

a vibration absorbing foam filling at least a subset of said hollow portions for absorbing vibrations transmitted to said first vertical support structures;

a second vibration isolation pad structure comprising an adhesive pad, caulking, or a combination of adhesive pads and caulking separating said plurality of first vertical support structures from said upper structure of said elevated structure;

wherein said first vibration isolation pads, said vibration absorbing foam, and said second vibration isolation pad coordinate to eliminate or substantially reduce the ability of vibrations from the building floor to reach the high-precision semiconductor device fabrication equipment operating on said upper surface of said elevated structure; and a vertical structural beam further separating said second isolation pad from said upper structure, said vertical structural beam connecting to said upper structure at a first joint and to said second isolation pad at a second joint; and a vibration frequency isolation structure in the form of either an adhesive pad, caulking, or a combination of adhesive pad and caulking at said first joint for vibration isolating said upper structure from said vertical structural beam and at said second joint for vibration isolating said vertical structural beam from said second isolation pad for further preventing vibration from process inhibiting vibrations at the building floor from affecting precision operation of the high-precision semiconductor device fabrication equipment on said upper structure, and further a heavy mass block associated between said plurality of base structures and said raised floor for vibration and sound reduction, said heavy mass block comprising a first layer of sound dampening adhesive, a reinforced concrete block connecting to said first layer of sound dampening adhesive, a second layer of sound dampening adhesive position on said reinforced concrete block opposite said first layer of sound dampening adhesive, and a block of porous high strength metal connecting to said second layer of sound dampening adhesive, said first layer of sound dampening adhesive positioned between the building floor and said reinforced concrete block for first reducing vibration induced deflection from the building floor to said concrete block, said second layer of sound dampening adhesive for further reducing deflection transmitted from said reinforced concrete block to said porous high strength metal block, wherein deflection and vibration carried from a waffle concrete floor to the high-precision semiconductor device fabrication equipment becomes effectively isolated; and further an electromagnetic interference (EMI) barrier on said heavy mass block for insulating or absorbing EMI for preventing EMI frequencies from adversely affecting operation of the high-precision semiconductor device fabrication equipment: and further a degausser on said high-precision semiconductor device fabrication equipment for removing magnetic arc blow associated with said EMI barrier.

5. The system of claim 4, further comprising an epoxy coating or powder coating with negative ion properties on said vertical support structure for structural strength.

6. The system of claim 4, further comprising a plurality of vibration isolation pedestal configurations for isolating vibrations associated with a plurality of MEP lines from said high-precision semiconductor device fabrication equipment to improve isolation of vibrations frequency transmitted from the plurality of MEP lines and through a building structure.

7. A high-precision semiconductor device fabrication facility having eliminated or substantially reduced process-inhibiting vibrations there within, comprising:
a plurality of hybrid tool pedestal structures for supporting high-precision semiconductor device fabrication equipment and providing vibration reduction spacing between a floor and an upper surface of a plurality of elevated structures, selected ones of said plurality of elevated structures further comprising:
a high-precision semiconductor device fabrication facility comprising a building having a building floor susceptible to vibration transmission, wherein said building may be exposed to and susceptible to transmitting process-inhibiting vibrations;
a hybrid tool pedestal system supporting a high-precision semiconductor device fabrication equipment; said hybrid tool pedestal system on a raised floor, said raised floor for being structurally separated from the building floor for providing a first portion of vibration isolation between the high-precision semiconductor device fabrication equipment and the building floor, said hybrid tool pedestal system comprising a plurality of base structures for positioning said hybrid tool pedestal system on said raised floor and an elevated structure for providing structural support and separating a high-precision semiconductor device fabrication equipment positioned on said elevated structure from said plurality of base structures;
a plurality of first vibration isolation pads, separating said plurality of base structures from said raised floor, said plurality of first vibration isolation pads comprising an adhesive pad, caulking, or a combination of adhesive pads and caulking;
a plurality of first vertical support structures positioned as a portion of said elevated structure and separating an upper structure of said elevated structure from at least selected ones of said plurality of base structures, said selected ones of said plurality of first vertical support structures further comprising a hollow portion capable of being filled;
a vibration absorbing foam filling at least a subset of said hollow portions for absorbing vibrations transmitted to said first vertical support structures;
a second vibration isolation pad comprising an adhesive pad, caulking, or a combination of adhesive pads and caulking for separating said plurality of first vertical support structures from said upper structure using;
wherein said first vibration isolation pads, said vibration absorbing foam, and said second vibration isolation pad coordinate to eliminate or substantially reduce the ability of vibrations from the building floor to reach high-precision semiconductor device fabrication equipment operating on said upper surface of said elevated structure; and
a vertical structural beam further separating said second isolation pad from said upper structure, said vertical structural beam connecting to said upper structure at a first joint and to said second isolation pad at a second joint; and
vibration frequency isolation structure in the form of either an adhesive pad, caulking, or a combination of adhesive pad and caulking at said first joint for vibration isolating said upper structure from said vertical structural beam and at said second joint for vibration isolating said vertical structural beam from said second isolation pad for further preventing vibration isolating said semiconductor device fabrication process inhibiting vibrations at the building floor from affecting precision operation of the high-precision semiconductor device fabrication equipment on said upper structure; and further
an electromagnetic interference (EMI) barrier on a heavy mass block for insulating or absorbing EMI for preventing EMI frequencies from adversely affecting operation of the high-precision semiconductor device fabrication equipment: and further
a degausser on said high-precision semiconductor device fabrication equipment for removing magnetic arc blow associated with said EMI barrier.

8. The high-precision device manufacturing facility of claim 7, wherein said first vibration isolation pad structure, said vibration absorbing foam, and said second isolation pad structure are formed for eliminating/substantially reducing both high frequency vibrations of approximately ranging from approximately 100 µm/s to approximately 800 µm/s and low frequency vibrations approximately ranging from approximately 3 µm/s to approximately 50 µm/s.

9. The high-precision device manufacturing facility of claim 7, further comprising a plurality of vibration isolation pedestal configurations for isolating vibrations associated with MEP lines using to improve isolation of vibrations frequency transmitted MEP lines and through a building structure.

\* \* \* \* \*